(12) United States Patent
Kawahara et al.

(10) Patent No.: US 8,427,864 B2
(45) Date of Patent: Apr. 23, 2013

(54) SEMICONDUCTOR STORAGE DEVICE

(75) Inventors: Takayuki Kawahara, Higashiyamato (JP); Kiyoo Itoh, Higashikurume (JP); Riichiro Takemura, Tokyo (JP); Kenchi Ito, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/375,751

(22) PCT Filed: Jun. 2, 2010

(86) PCT No.: PCT/JP2010/059334
§ 371 (c)(1),
(2), (4) Date: Dec. 1, 2011

(87) PCT Pub. No.: WO2010/140615
PCT Pub. Date: Dec. 9, 2010

(65) Prior Publication Data
US 2012/0081952 A1 Apr. 5, 2012

(30) Foreign Application Priority Data
Jun. 3, 2009 (JP) .................................. 2009-134122

(51) Int. Cl.
*G11C 11/00* (2006.01)
(52) U.S. Cl.
USPC ............ 365/158; 365/148; 365/171; 977/935
(58) Field of Classification Search .................... 365/48, 365/55, 62, 66, 74, 78, 80–93, 100, 130, 365/131, 148, 158, 171–173, 209, 213, 225.5, 230.07, 232, 243.5; 257/421, E21.665; 438/3; 977/933–935
See application file for complete search history.

(56) References Cited

U.S. PATENT DOCUMENTS

| | | | |
|---|---|---|---|
| 7,888,755 B2 * | 2/2011 | Hosomi et al. | ................ 257/421 |
| 2002/0001225 A1 | 1/2002 | Poechmueller | |
| 2006/0114618 A1 * | 6/2006 | Hosomi et al. | ............ 360/324.1 |
| 2006/0133136 A1 | 6/2006 | Iwata | |

FOREIGN PATENT DOCUMENTS

| | | |
|---|---|---|
| JP | 2002-093149 A | 3/2002 |
| JP | 2004-152449 A | 5/2004 |
| JP | 2006-179125 A | 7/2006 |
| WO | WO 2005-038812 A1 | 4/2005 |

* cited by examiner

*Primary Examiner* — Harry W Byrne
(74) *Attorney, Agent, or Firm* — Miles & Stockbridge P.C.

(57) ABSTRACT

To write information on a memory cell of SPRAM formed of an MOS transistor and a tunnel magnetoresistive element, the memory cell is supplied with a current in a direction opposite to a direction of a current required for writing the information on the memory cell, and then, the memory cell is supplied with a current required for writing. In this manner, even when the same information is sequentially written on the memory cell, since the currents in the two directions are caused to flow in pairs in the tunnel magnetoresistive element of the memory cell each time information is rewritten, deterioration of a film that forms the tunnel magnetoresistive element can be suppressed. Therefore, reliability of the SPRAM can be improved.

9 Claims, 26 Drawing Sheets

AFTER ONE-WAY CURRENT SEQUENTIALLY FLOWS

AFTER CURRENTS IN TWO DIRECTIONS SEQUENTIALLY FLOW

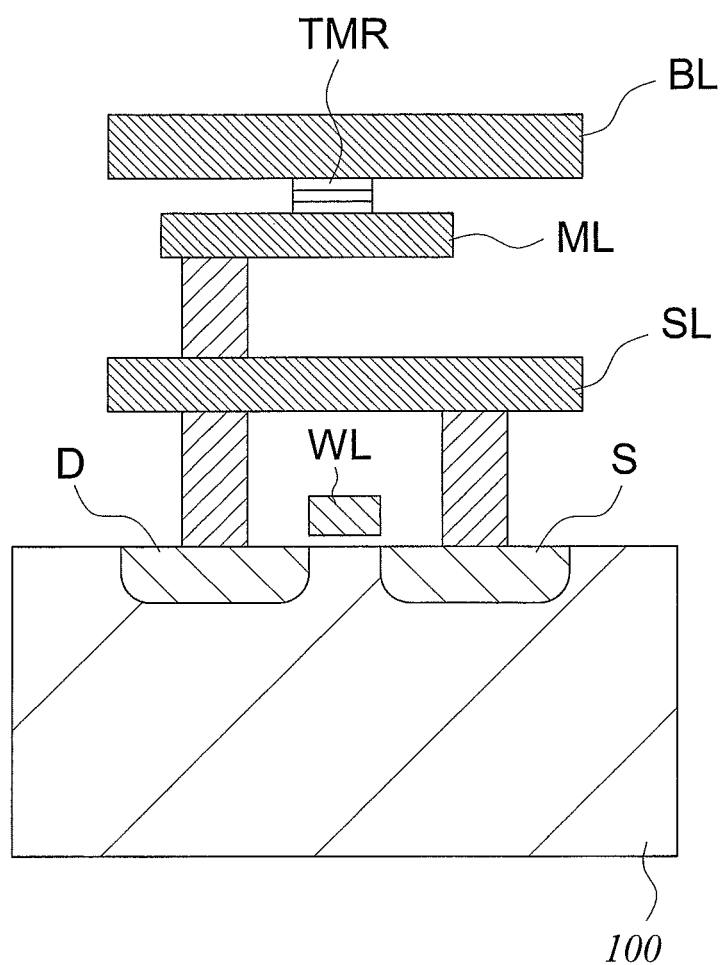

Parallel

Anti-parallel

AT EARLY STAGE

AFTER ONE-WAY CURRENT SEQUENTIALLY FLOWS

AFTER CURRENTS IN TWO DIRECTIONS SEQUENTIALLY FLOW

AT EARLY STAGE

AFTER ONE-WAY CURRENT SEQUENTIALLY FLOWS

Parallel

Anti-parallel

Anti-parallel

Parallel

SEMICONDUCTOR STORAGE DEVICE

TECHNICAL FIELD

The present invention relates to a semiconductor storage device, and particularly relates to a technology effectively applied to a semiconductor storage device having a memory cell in which information is stored by utilizing changes in magnetic resistance.

BACKGROUND ART

Among nonvolatile semiconductor memories, MRAM (Magnetoresistive Random Access Memory) which is a memory utilizing changes in magnetic resistance and SPRAM (Spin Transfer Torque RAM) can perform fast operations, and at the same time, they can function as a nonvolatile RAM that can practically and infinitely reprogrammable (Japanese Patent Application Laid-Open Publication No. 2006-179125 and Japanese Patent Application Laid-Open Publication No. 2002-093149 (Patent Documents 1 and 2)).

As illustrated in an equivalent circuit diagram of FIG. 26A and a schematic cross-sectional view of FIG. 26B, the SPRAM is formed of a tunnel magnetoresistive element TMR, a select transistor MCT, a word line WL, a bit line BL, and a source line SL. Further, as illustrated in FIG. 27, the tunnel magnetoresistive element TMR has at least two magnetic layers. One of these layers is a fixed layer PL in which the direction of spin is fixed, and the other is a free layer FL that takes two states in which the directions of spin are parallel and anti-parallel to the fixed layer PL. A tunnel barrier film TB formed of MgO or the like is provided between these magnetic layers.

Storage of information is performed according to the directions of spin of the free layer FL. That is, in the anti-parallel state to the fixed layer PL of FIG. 27A, the electric resistance of the tunnel magnetoresistive element TMR is set in a high resistance state, and, in the parallel state of FIG. 27B, the electric resistance is set in a low resistance state. Therefore, these states are assigned to "0" and "1" of the information. In the reading operation, magnitude of the resistance of the tunnel magnetoresistive element TMR is read, thereby obtaining the stored information. In the rewriting operation, a current is applied vertically to the tunnel barrier film TB and the free layer FL so that the direction of spin of the free layer FL is controlled. That is, when a current is caused to flow in the direction toward the free layer FL from the fixed layer PL, electrons having the direction of spin that makes the direction of magnetization of this free layer FL opposite to the direction of the fixed layer PL mainly flow into the free layer FL. Consequently, when this current value exceeds a fixed threshold value, the directions of the magnetization of the fixed layer PL and the free layer FL become anti-parallel. In contrast, when a current is caused to flow toward the fixed layer PL from the free layer FL, electrons having the direction of spin that makes the direction of the magnetization of this free layer FL same as the direction of the fixed layer PL mainly flow into the free layer FL. When this current value exceeds a fixed threshold value, the directions of the magnetization of the fixed layer PL and the free layer FL become parallel. That is, in this memory cell, the information "0" and "1" is distinguished in writing by the directions of current. When this system is employed, the current (threshold value) required for rewriting the information is made proportional to magnitude of the tunnel magnetoresistive element TMR. Consequently, the memory cell can be miniaturized along with reduction of the rewriting current, and thus scalability becomes excellent.

PRIOR ART DOCUMENTS

Patent Documents

Patent Document 1: Japanese Patent Application Laid-Open Publication No. 2006-179125
Patent Document 2: Japanese Patent Application Laid-Open Publication No. 2002-093149

DISCLOSURE OF THE INVENTION

Problems to be Solved by the Invention

However, since the SPRAM can be freely rewritten by every bit, a situation arises, for example, where only "0" (or "1") is sequentially kept being written in one memory cell. Since the rewrite of the information is performed by the direction of the current, in this case, the current of only one direction sequentially flows into the memory cell. This makes a current of only one direction to flow in the tunnel barrier film TB, the fixed layer PL, and the free layer FL forming the tunnel magnetoresistive element TMR, and consequently, for example, unnecessary traps are formed in the tunnel barrier film TB, and deterioration of the film such as a structural change of magnetization for the fixed film PL and the free layer FL is posed.

A preferred aim of the present invention is to provide a technology capable of improving reliability of a nonvolatile semiconductor memory that utilizes the changes of magnetic resistance.

The above and other preferred aims and novel characteristics of the present invention will be apparent from the description of the present specification and the accompanying drawings.

Means for Solving the Problems

The typical ones of the inventions disclosed in the present application will be briefly described as follows.

A semiconductor storage device which is an invention of the present application includes: a plurality of word lines; a plurality of bit lines and a plurality of source lines extending in a direction orthogonal to the plurality of word lines, respectively; and a plurality of memory cells arranged at predetermined intersection points of the plurality of word lines, the plurality of bit lines, and the plurality of source lines, the memory cell being formed of a select transistor and a tunnel magnetoresistive element having different resistance values according to stored information, the tunnel magnetoresistive element having a tunnel barrier film with a fixed layer and a free layer formed of magnetic materials arranged and both sides the tunnel barrier film, the fixed layer having a direction of magnetization fixed to a predetermined direction, and the free layer having a direction of magnetization either parallel or anti-parallel to the direction of electron spin of the fixed layer, the tunnel magnetoresistive element having different resistance values depending on whether the direction of magnetization of the free layer is parallel or anti-parallel to the direction of electron spin of the fixed layer, the direction of magnetization of the free layer being changed by a direction of a current flowing in the tunnel magnetoresistive element, a gate electrode of the select transistor being electrically connected to the word line, one of the source and drain regions of the select transistor being electrically connected to one of the other terminals of the tunnel magnetoresistive element, the other terminal of the tunnel magnetoresistive element being electrically connected to one of the bit line or the source line, and the other of the source and drain regions of the select transistor being electrically connected to the other of the bit line or the source line, wherein, to write information in the memory cell, a current in a direction opposite to a current necessary for writing is supplied to the memory cell, and then, means for supplying the current necessary for writing is provided.

Effects of the Invention

The effects obtained by typical aspects of the present invention will be briefly described below.

To write information in a memory cell, the memory cell is supplied with a current in a direction opposite to a direction of a current required for writing the information, and then, even when the same information is written sequentially in this memory cell by supplying a current required for writing the information, as the currents in the two directions are caused to flow in pairs into a tunnel magnetoresistive element of this memory cell each time information is rewritten, deterioration of the film that constitutes the tunnel magnetoresistive element can be suppressed.

BRIEF DESCRIPTIONS OF THE DRAWINGS

FIG. 3 is a schematic cross-sectional view of the SPRAM, which is the first embodiment of the present invention;

Figure 11A:
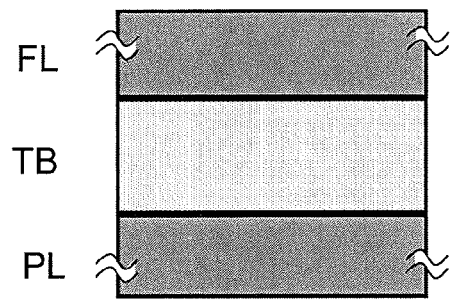
Figure 11B:
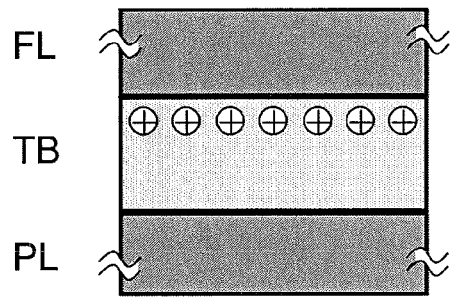
Figure 11C:
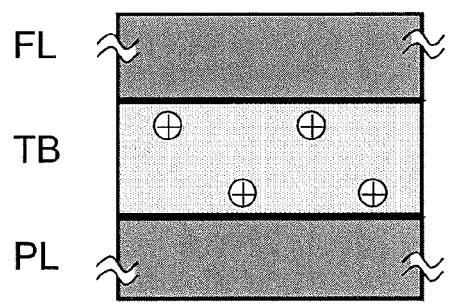
Figure 12A:
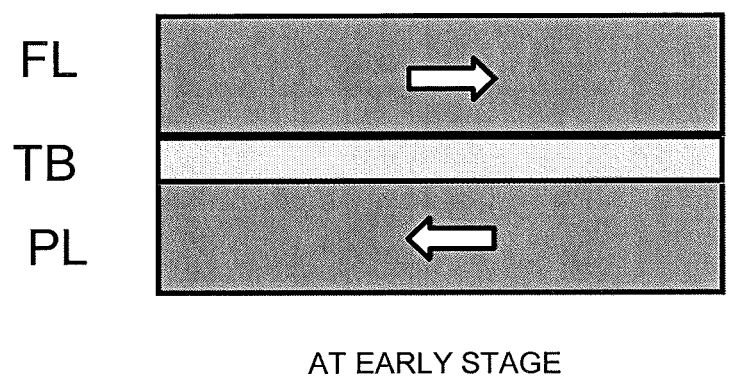
Figure 12B:
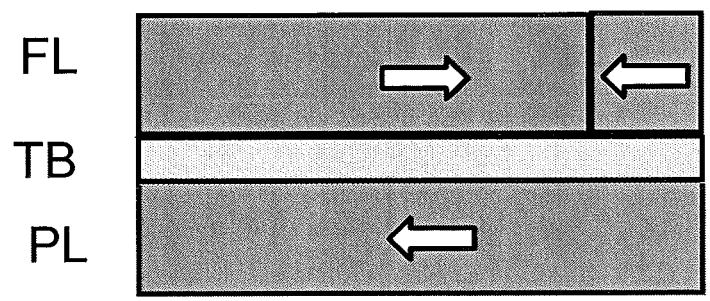
Figure 13:
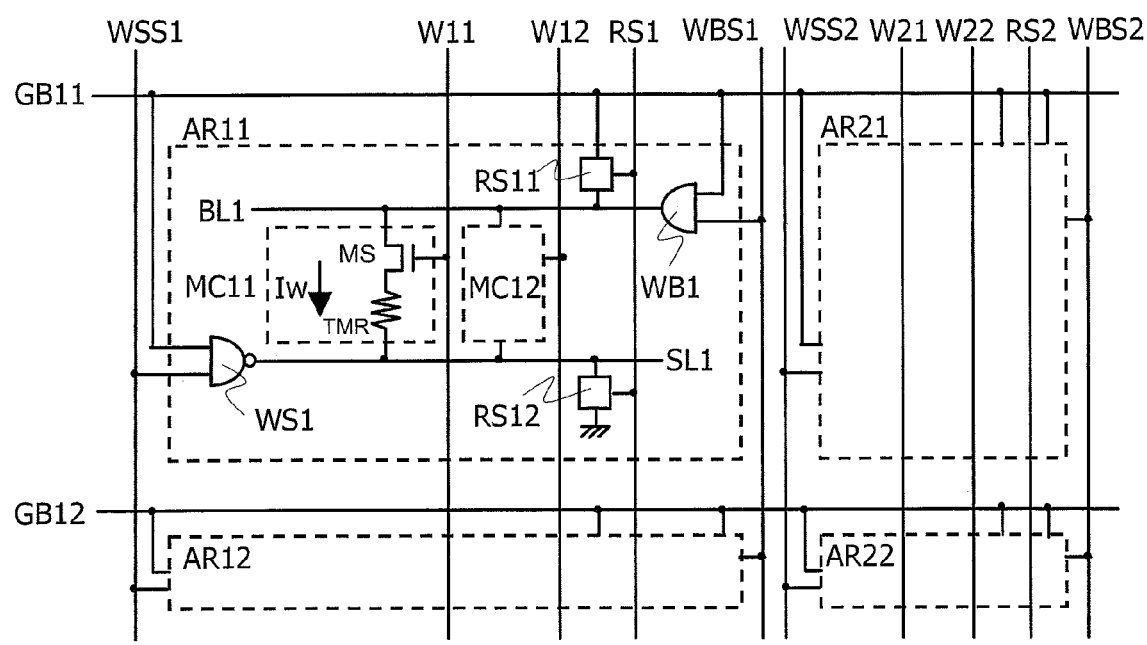
Figure 14:
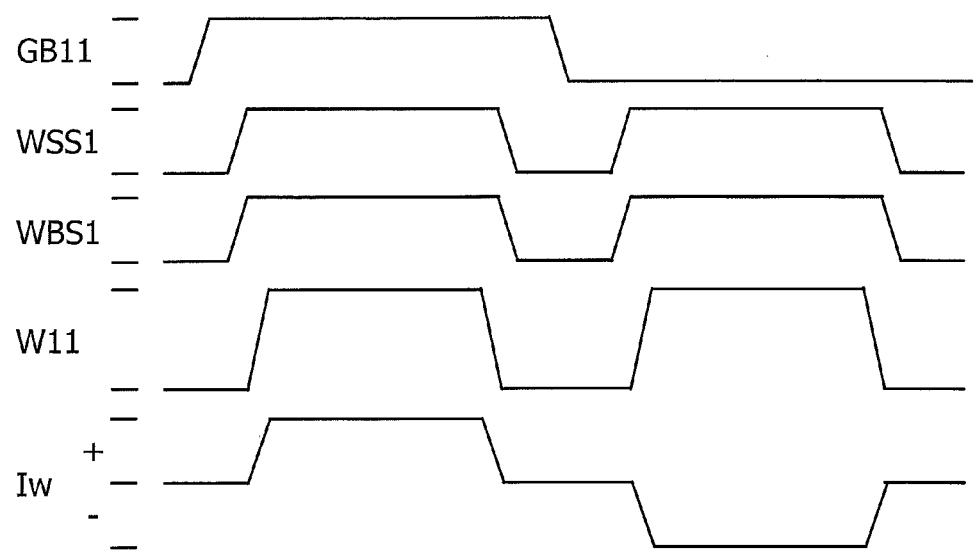
Figure 15:
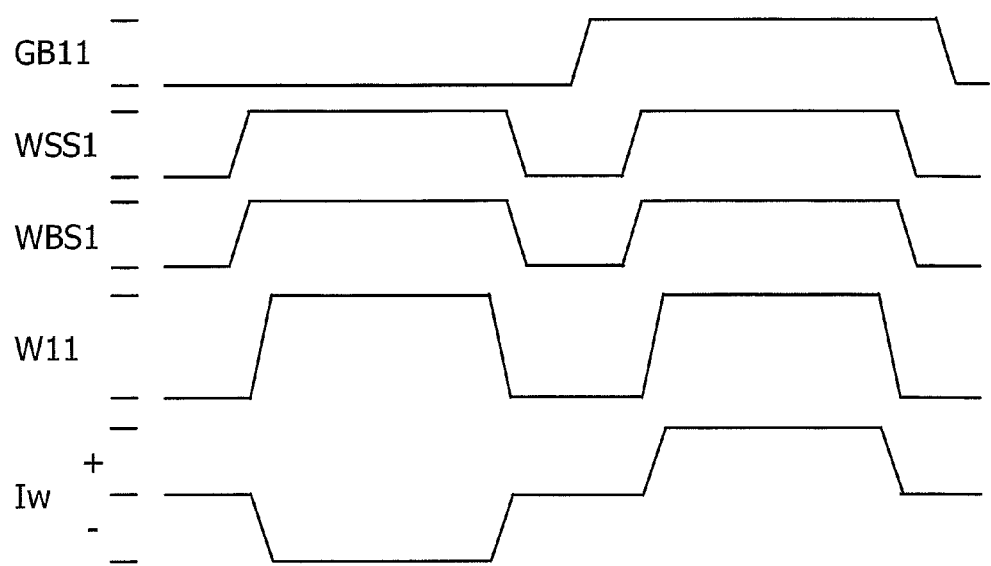
Figure 16:
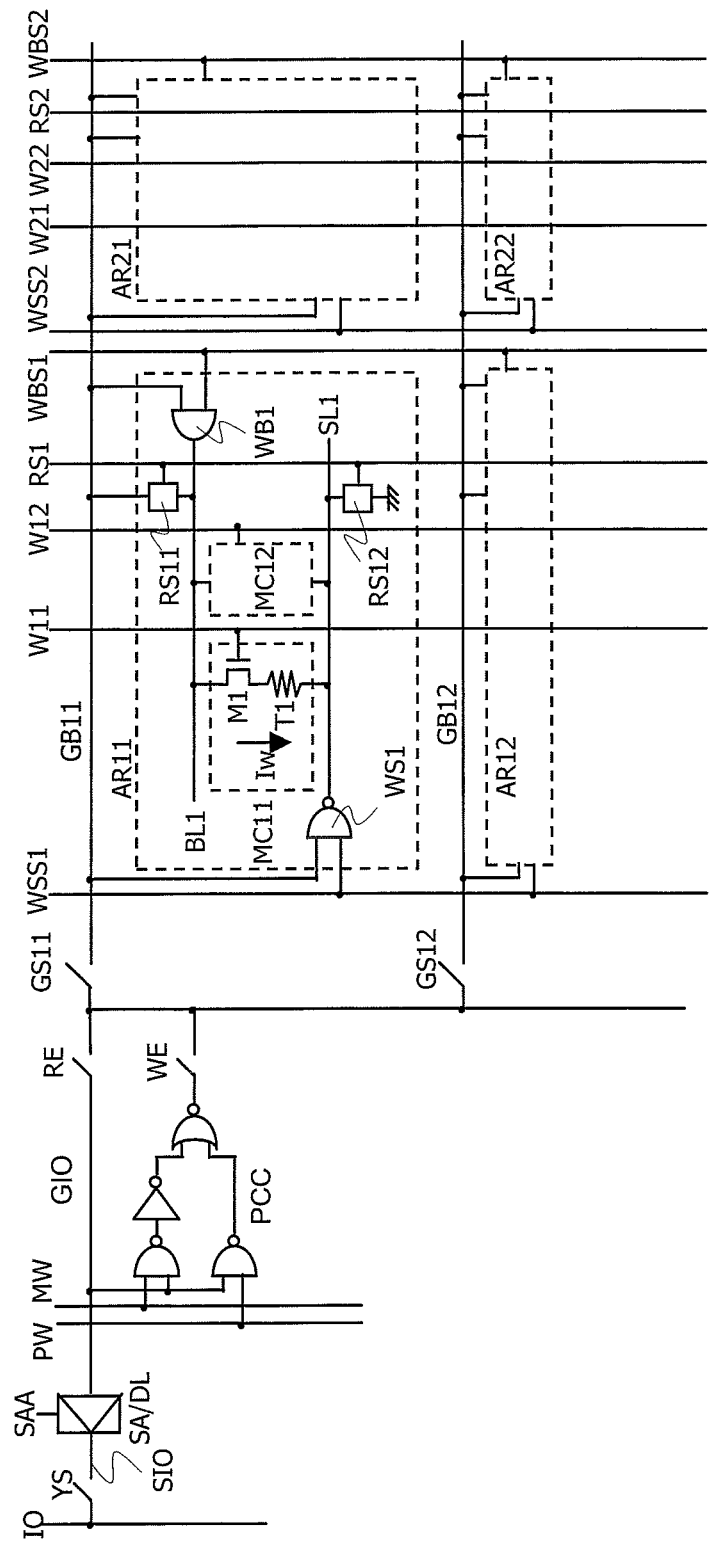
Figure 17:
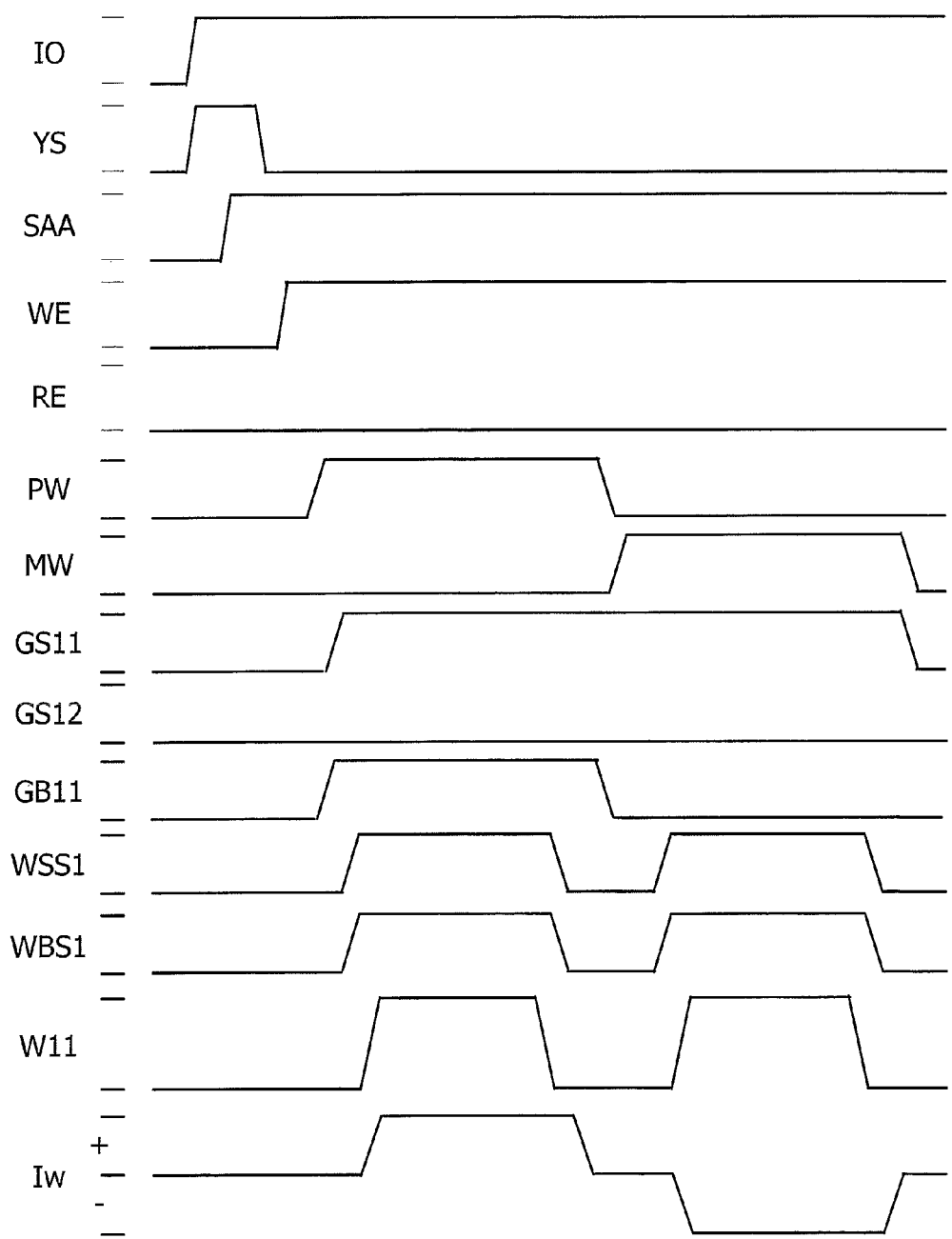
Figure 18:
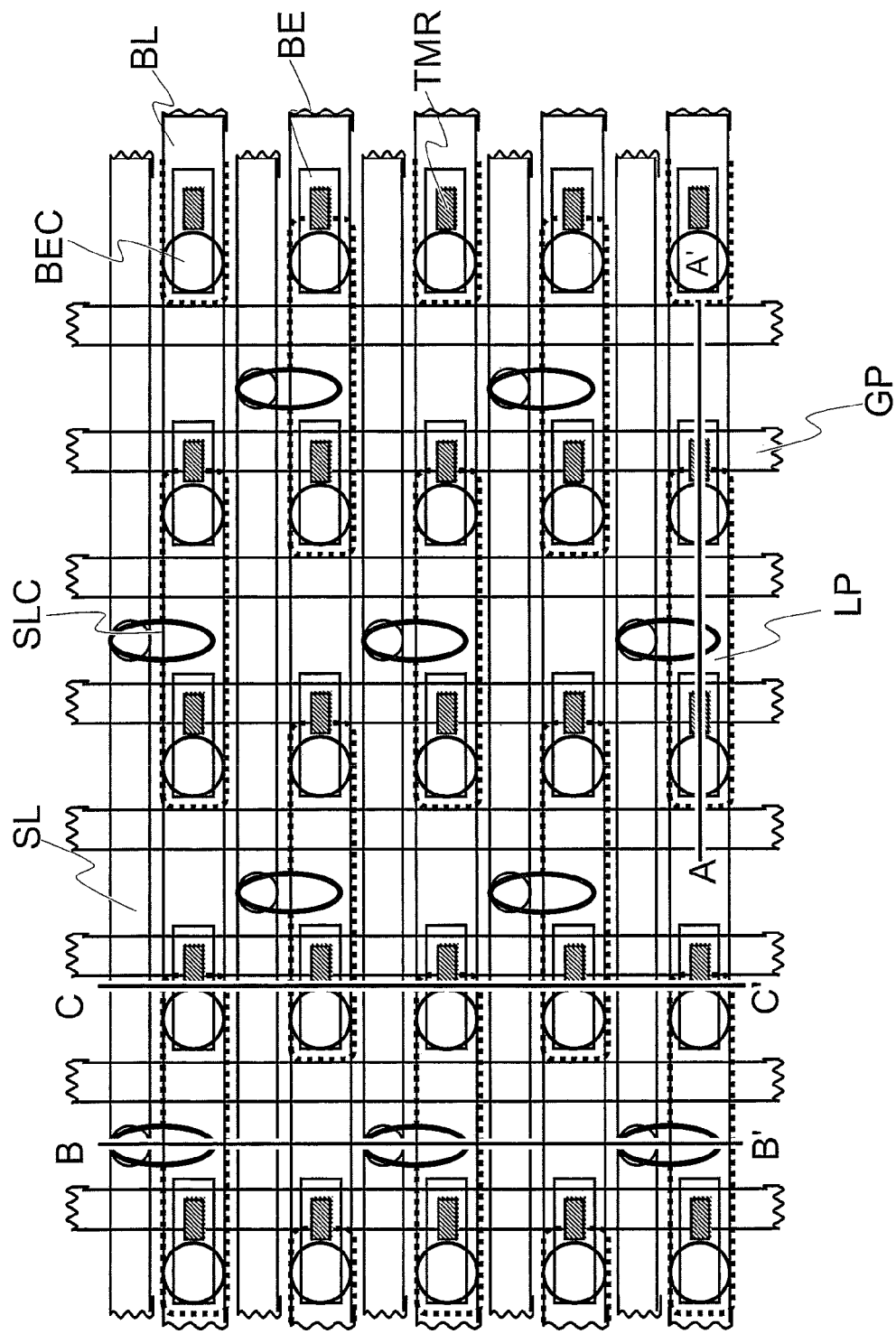
Figure 19:
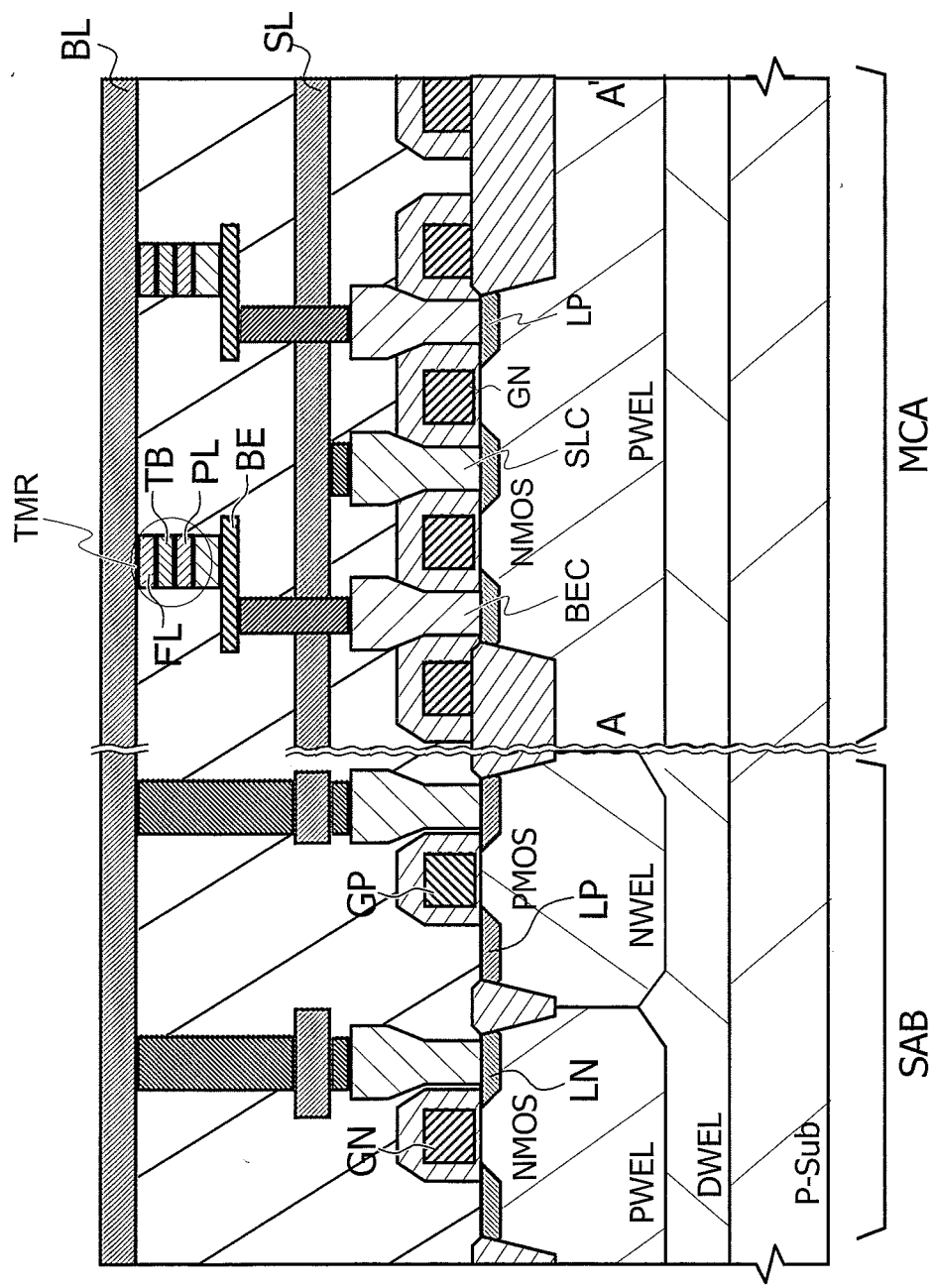
Figure 20A:
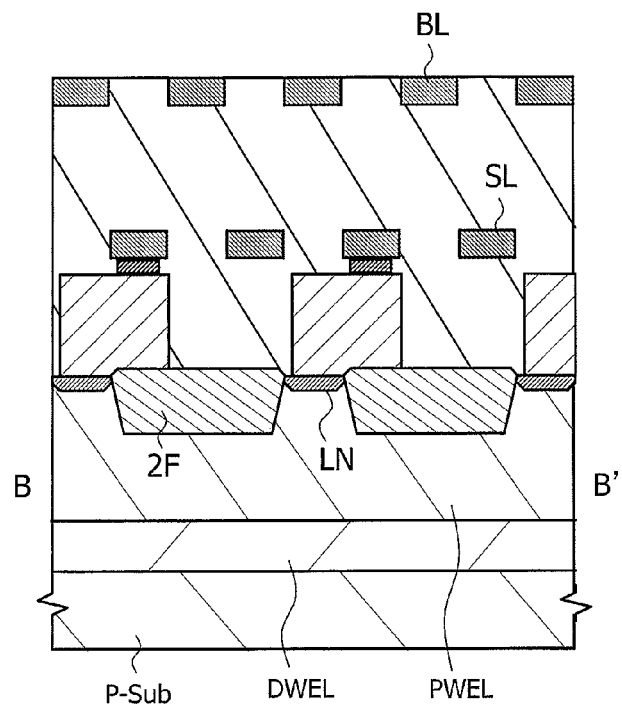
Figure 20B:
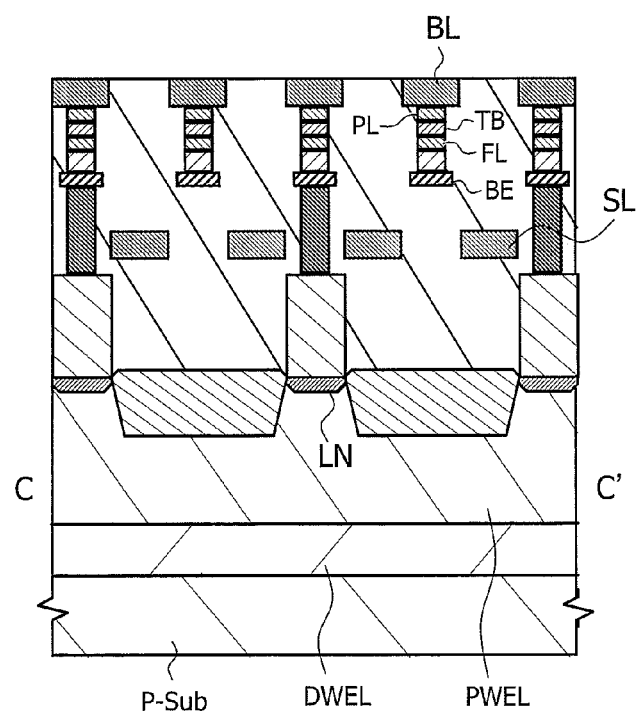
Figure 21:
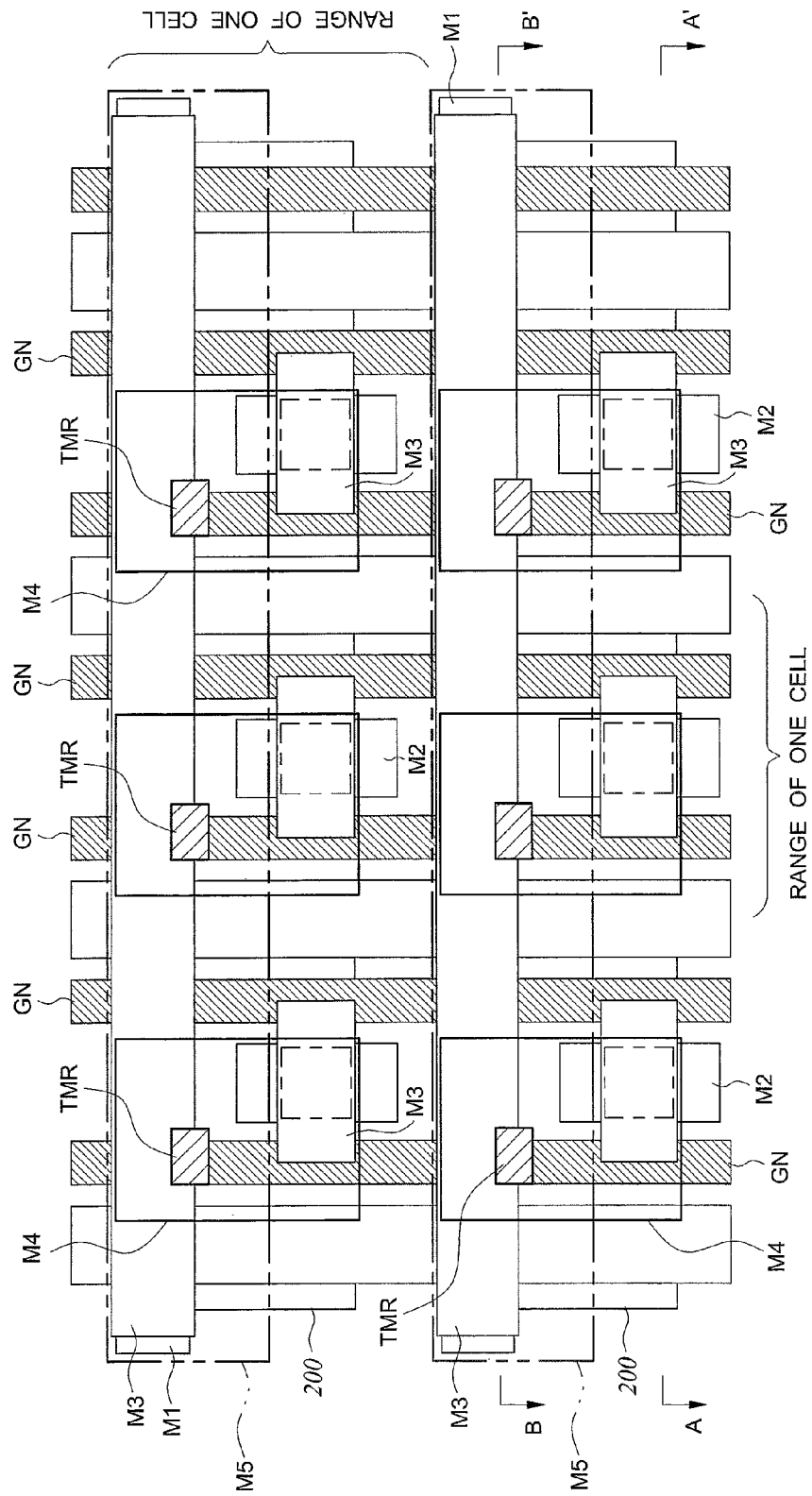
Figure 22:
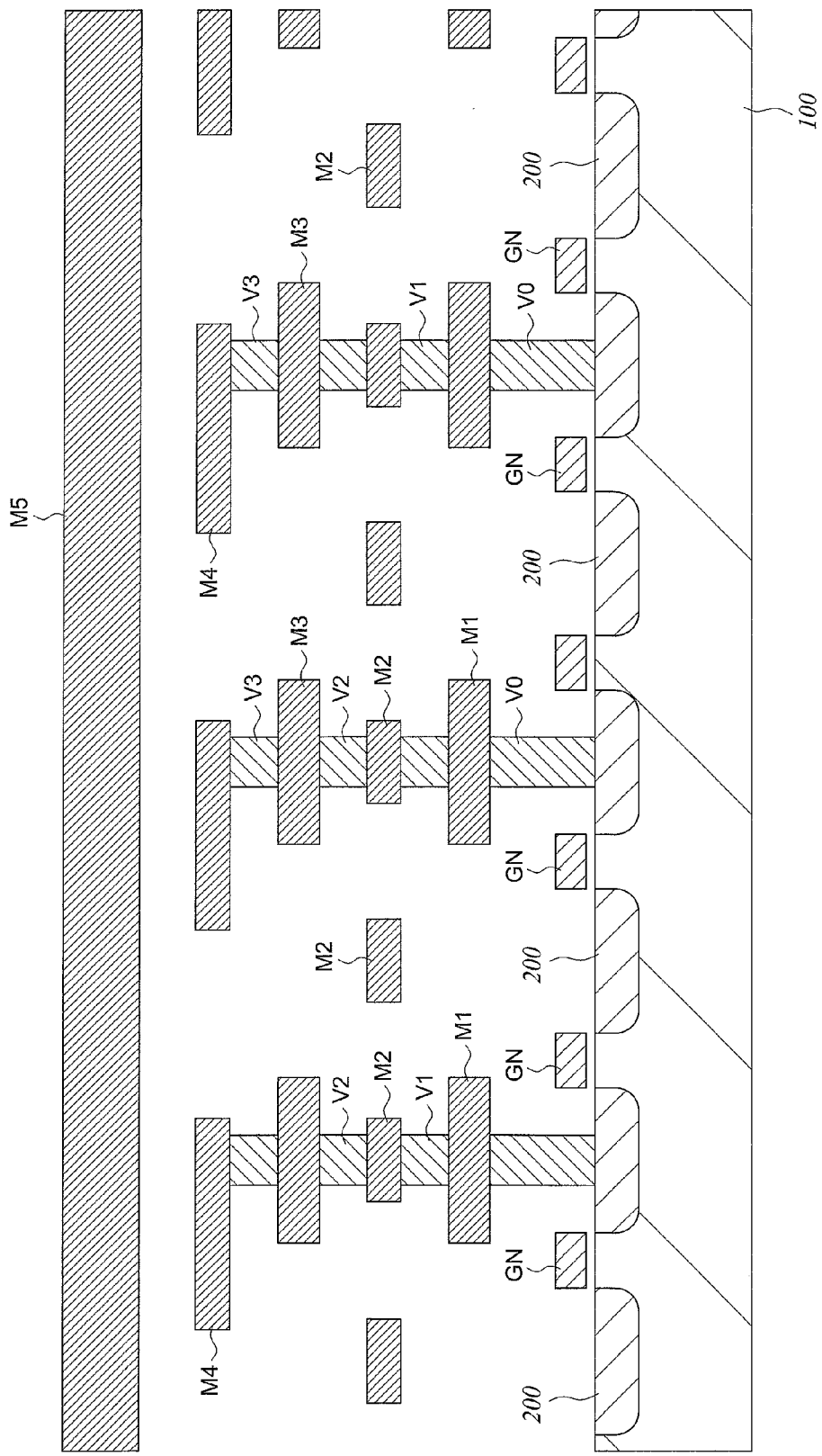
Figure 23:
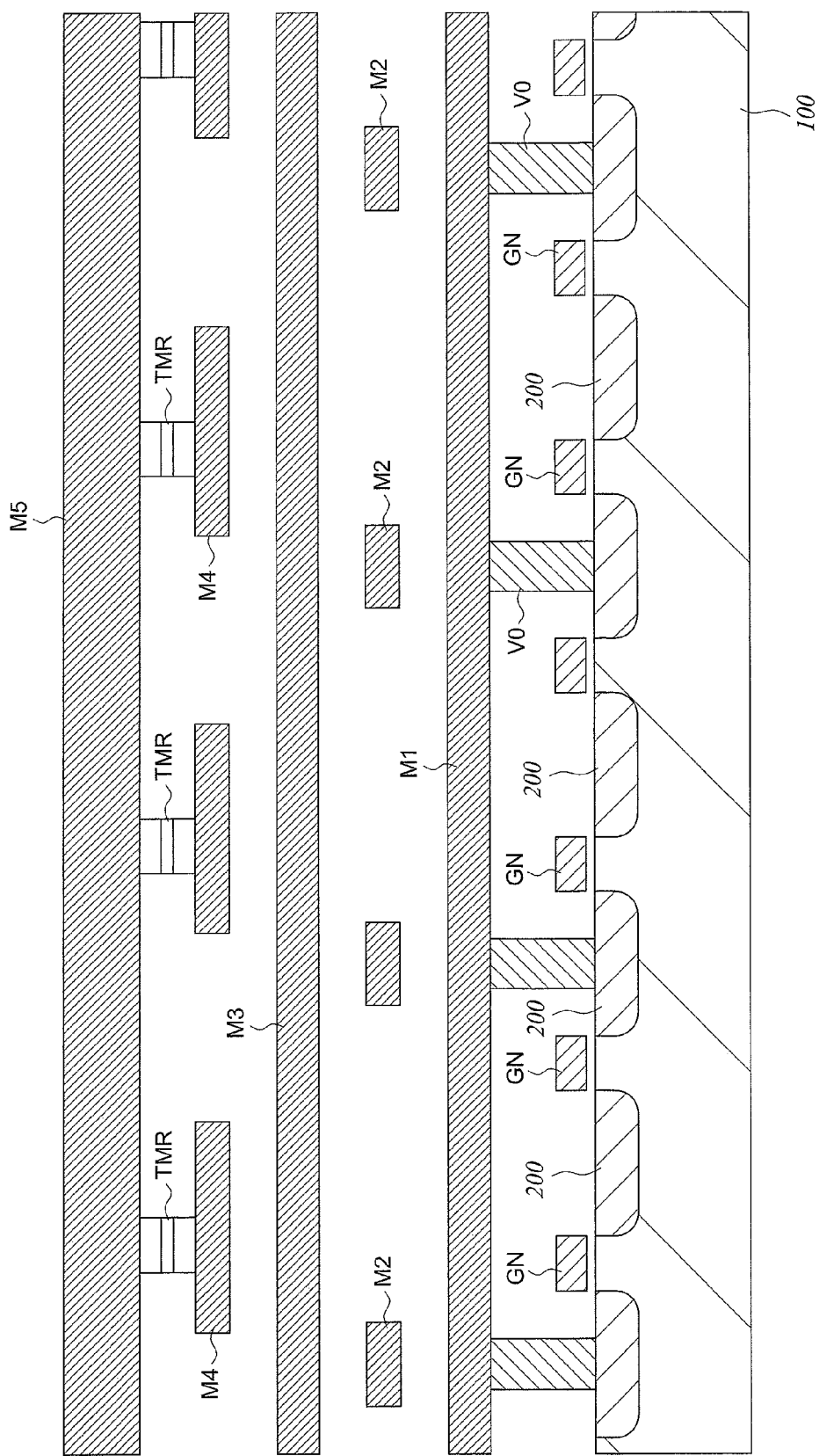
Figure 24:
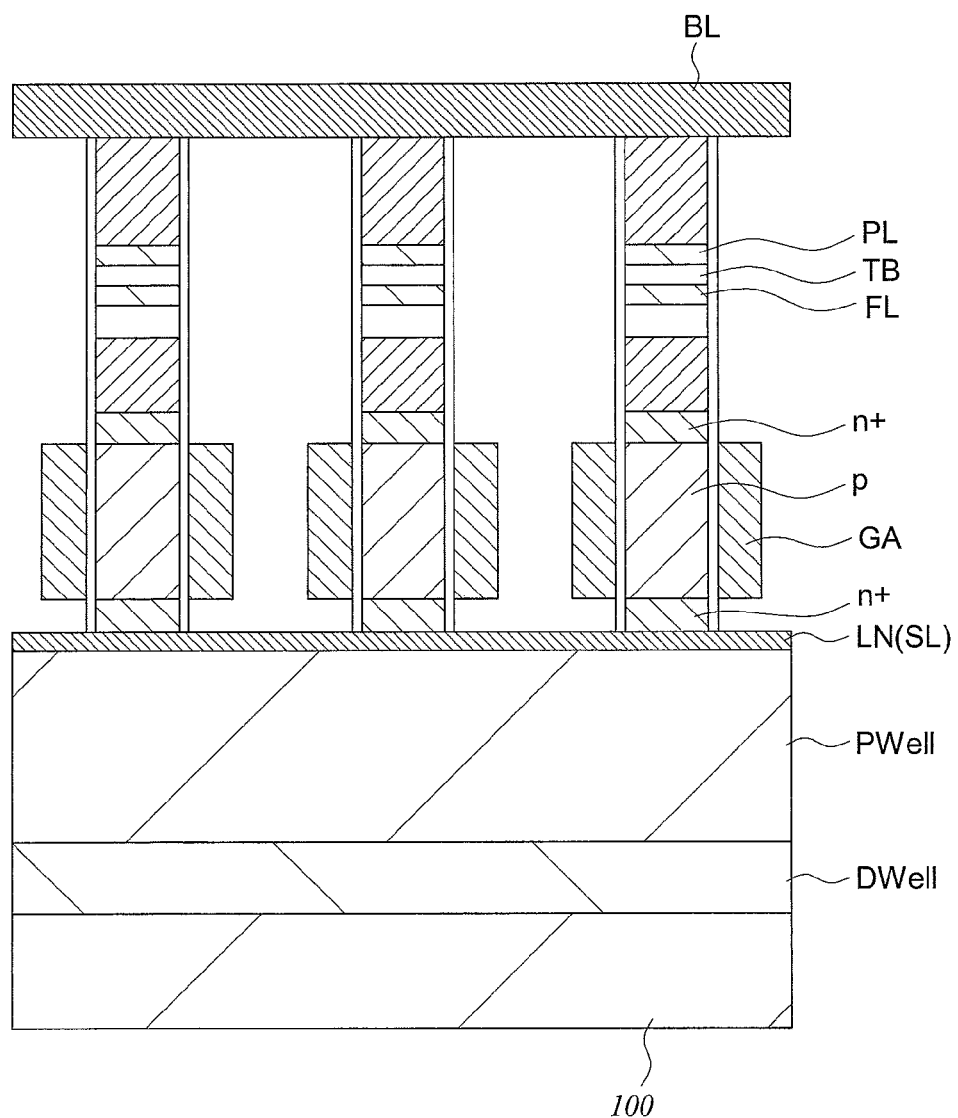
Figure 25A:
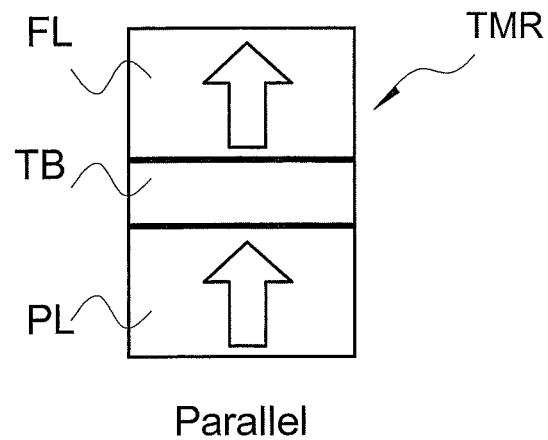
Figure 25B:
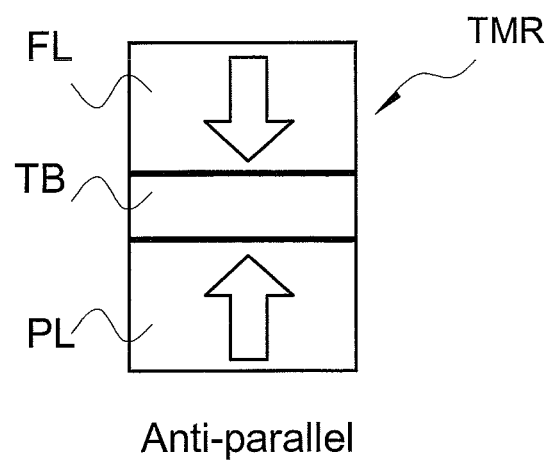
Figure 26A:
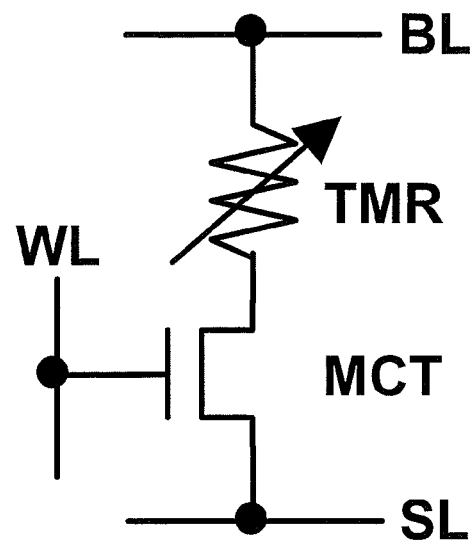
Figure 26B:
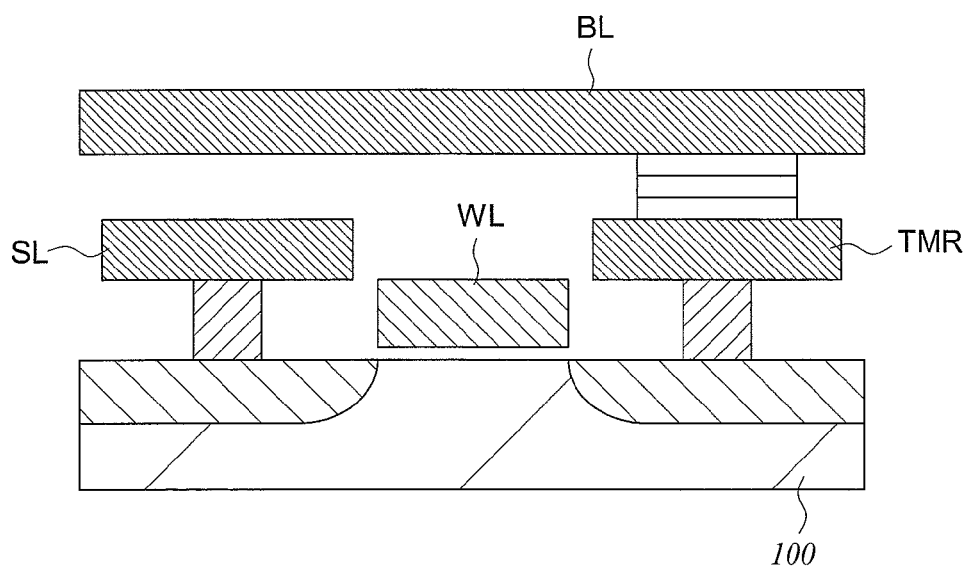
Figure 27A:
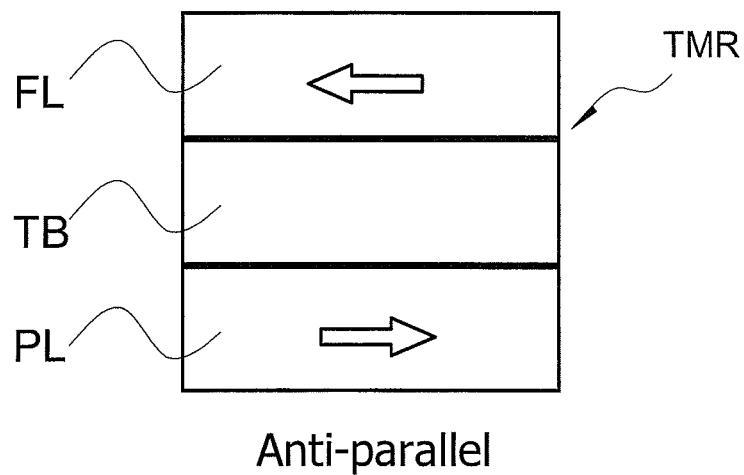
Figure 27B:
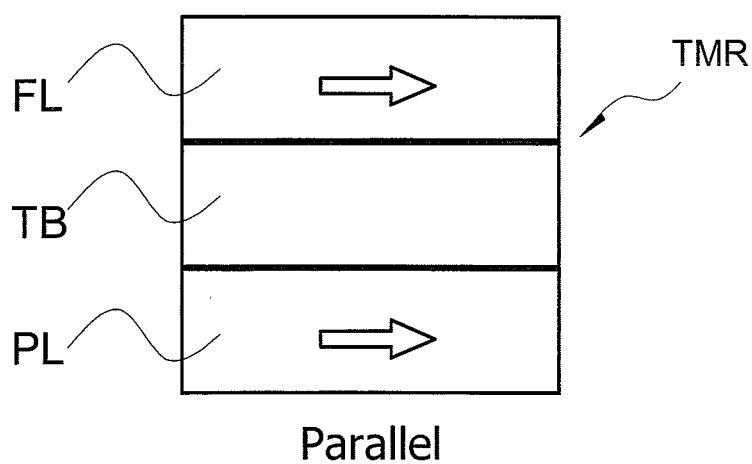

FIGS. 11A, 11B, and 11C are diagrams explaining an effect of the SPRAM, which is the sixth embodiment of the present invention;

FIGS. 12A and 12B are diagrams explaining problems of a conventional SPRAM;

FIG. 13 is a circuit diagram illustrating a memory cell array of an SPRAM, which is a seventh embodiment of the present invention;

FIG. 14 is a timing chart illustrating a writing operation of the SPRAM, which is the seventh embodiment of the present invention;

FIG. 15 is a timing chart illustrating a writing operation of the SPRAM, which is the seventh embodiment of the present invention;

FIG. 16 is a circuit diagram illustrating a memory cell array of an SPRAM, which is an eighth embodiment of the present invention;

FIG. 17 is a timing chart illustrating a writing operation of the SPRAM, which is the eighth embodiment of the present invention;

FIG. 18 is a plan view illustrating a memory cell array of an SPRAM, which is a ninth embodiment of the present invention;

FIG. 19 is a cross-sectional view illustrating the memory cell array and a peripheral circuit taken along the line A-A' of FIG. 18;

FIG. 20A is a cross-sectional view of the memory cell array taken along the line B-B' of FIG. 18, and FIG. 20B is a cross-sectional view of the memory cell array taken along the line C-C' of FIG. 18;

FIG. 21 is a plan view illustrating a memory cell array of an SPRAM, which is a tenth embodiment of the present invention;

FIG. 22 is a cross-sectional view of the memory cell array taken along the line A-A' of FIG. 21;

FIG. 23 is a cross-sectional view of the memory cell array taken along the line B-B' of FIG. 21;

FIG. 24 is a cross-sectional view illustrating a memory cell array of SPRAM, which is an eleventh embodiment of the present invention;

FIGS. 25A and 25B are diagrams explaining directions of magnetization in a tunnel magnetoresistive element of an SPRAM, which is a twelfth embodiment of the present invention;

FIG. 26A is an equivalent circuit diagram of a conventional SPRAM and FIG. 26B is a schematic cross-sectional view of the conventional SPRAM; and FIGS. 27A and 27B are diagrams explaining directions of magnetization in a tunnel magnetoresistive element of the conventional SPRAM.

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiment, and the repetitive description thereof will be omitted. In addition, the description of the same or similar portions is not repeated in principle unless particularly required in the following embodiments. Also, in some drawings used in the embodiments, hatching is used even in a plan view so as to make the drawings easy to see.

First Embodiment

Figure 1:
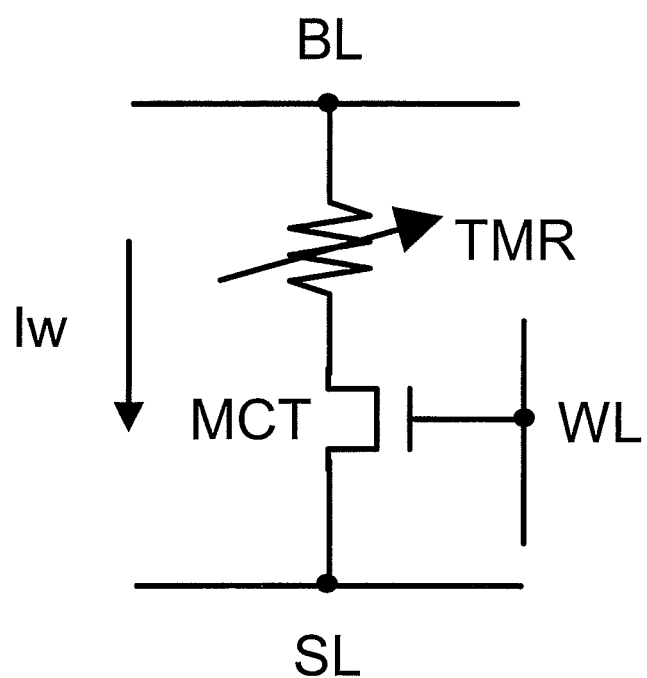
FIG. 1 is an equivalent circuit diagram of an SPRAM, which is a first embodiment of the present invention.

FIG. 1 is an equivalent circuit diagram of an SPRAM according to the present embodiment. This SPRAM has a memory cell composed of a select transistor MCT and a tunnel magnetoresistive element TMR that provides different resistance values according to its stored information. The select transistor MCT and the tunnel magnetoresistive element TMR are arranged in a series-connected state between a bit line BL and a source line SL, and the select transistor MCT is controlled by a word line WL connected to a gate electrode of the select transistor MCT. In the following explanation, a current (Iw) flowing between the bit line BL and the source line SL has the direction of an arrow (the direction flowing from the bit line BL to the source line SL) defined as a positive (+) direction.

Next, an operation example of the memory cell will be described with reference to FIGS. 2A and 2B. In a signal of the word line WL, a low level is 0, and a high level is V1. Also in signals of the bit line BL and the source line SL, a low level is 0, and a high level is V1. Here, although the values of the high level are made equal (=V1) to one another in three signal lines (WL, BL, and SL), the values may be different from one another. For example, the high level of the word line WL may be higher than the high levels of the bit line BL and the source line SL. Further, although an assignment of the information "0" and "1" is performed by the direction of the current (Iw), here, when the direction of the current (Iw) is positive, "1" is written, and when the direction of the current (Iw) is negative, "0" is written.

Figure 2A:
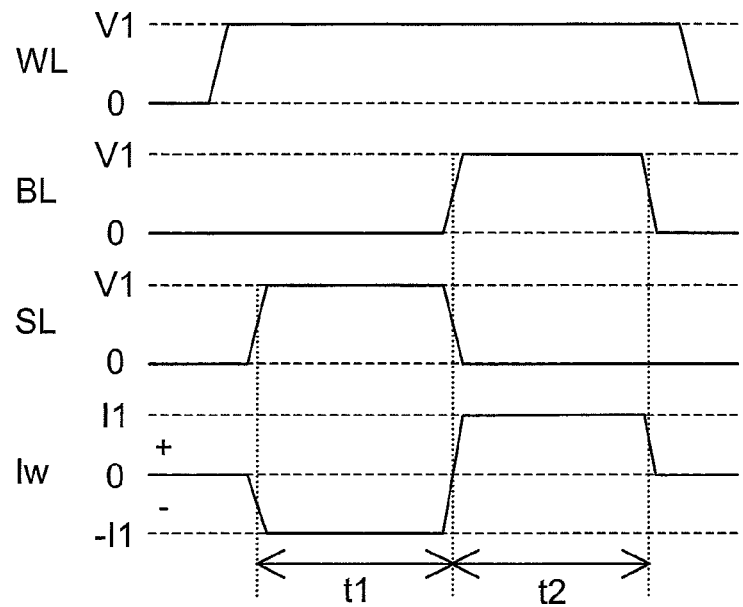
FIGS. 2A and 2B are timing charts illustrating a writing operation of the SPRAM, which is the first embodiment of the present invention.

In the operation example of FIG. 2A, the direction of the current (Iw) corresponding to the original write information is expressed as a positive direction. First, a current −I1 in the opposite direction to the direction of the current Iw is caused to flow, and then, a current I1 having the direction of the original write current is caused to flow. That is, when this memory cell is selected for rewrite, the word line WL changes to the high level V1 from the low level 0. Then, the bit line BL remains at the low level 0, whereas the source line SL is changed to the high level V1 from the low level 0. Thus, the current is caused to flow in the direction toward the bit line BL from the source line SL. When this current is greater than a threshold value, this memory cell is written with information that is different from the original rewrite information. Here, there are some cases where the writing of the information different from the original rewrite information cannot be completed.

A write time in which the current (−I1) of the opposite direction is caused to flow, that is, a pulse width is t1. When this writing is completed, the source line SL returns to the low level 0. Incidentally, when the information already written is this different information, a state of the information itself does not change. Then, the original write current (I1) is caused to flow. Here, while the source line SL remains at the low level 0, the bit line BL is changed from the low level 0 to the high level V1. The pulse width at this time is t2. In this example, t1 and t2 are made substantially equal (t1≈t2). This current (I1) is obtained to be greater than a current of a rewrite threshold value, and the memory cell is written with desired information. When the writing is completed, the word line WL returns to the low level 0.

Figure 2B:
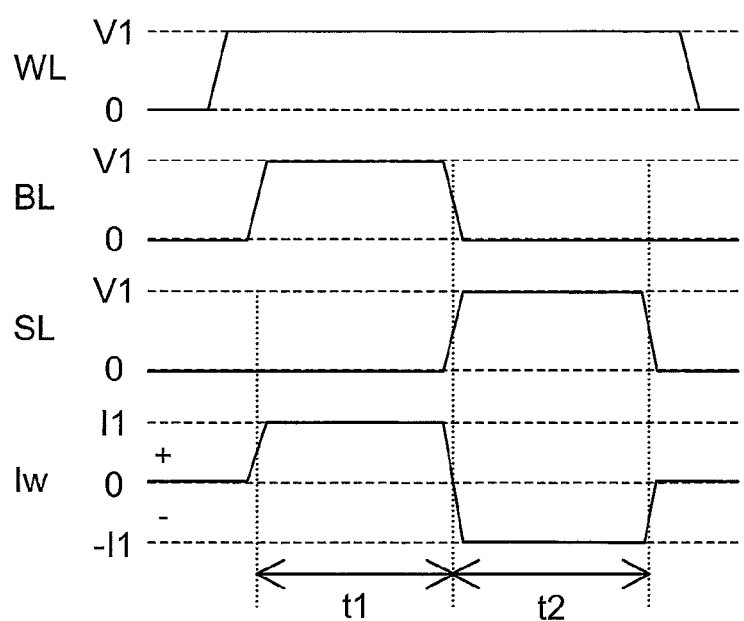

FIG. 2B is a case opposite to the above-described operation example. That is, it is the case where the current corresponding to the information to be originally written is −I1 In this case, after the word line WL is selected, first, a current (I1) of the opposite direction is caused to flow by changing the bit line BL from the low level 0 to the high level V1, and then, the original write current (−I1) is caused to flow by changing the source line SL from the low level 0 to the high level V1. In this way, the current (I1) in the direction opposite to the original write current (−I1) is caused to flow first, and then, the original write current (−I1) is caused to flow. Thus, even when the writing of the same information is sequentially performed in this memory cell, since the currents in the two directions (−I1 and I1) are caused to flow in pairs in the tunnel magnetoresistive element TMR of this memory cell each time information is rewritten, deterioration of the film that forms the tunnel magnetoresistive element TMR is suppressed.

FIG. 3 is a schematic cross-sectional view of the memory cell described above. A MOSFET that forms the select transistor of the memory cell is formed on a silicon substrate 100. Although this MOSFET includes a drain region D, a source region S, and a gate electrode integrally formed with the word line WL, the electrical operations of the drain region D and the source region S can be replaced each other as need arises.

The source region S of the MOSFET is connected with the source line SL, and the drain region D is connected with the bit line BL. The source line SL and the bit line BL are formed of metal wires. Between the source line SL and the bit line BL, the tunnel magnetoresistive element TMR is formed. As illustrated in the drawing, the tunnel magnetoresistive element TMR is arranged just above a metal wire ML connected to the drain region D of the MOSFET. By arranging the tunnel magnetoresistive element TMR just above the metal wire ML having a flat surface in this way, the tunnel magnetoresistive element TMR having good characteristics can be realized.

Figure 4A:
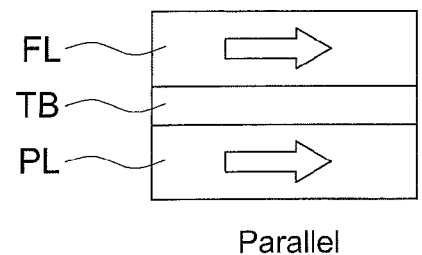
FIGS. 4A and 4B are diagrams explaining directions of magnetization in a tunnel magnetoresistive element of the SPRAM, which is the first embodiment of the present invention.
Figure 4B:
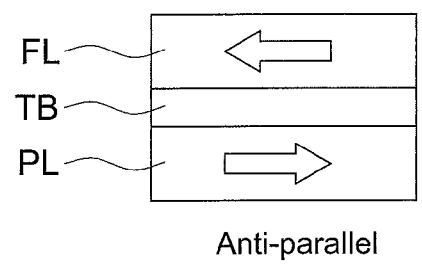

The tunnel magnetoresistive element TMR has at least two magnetic layers. One of these layers is a fixed layer PL in which the direction of spin is fixed, and the other is a free layer FL that assumes two states of directions of spin which are either the parallel state of FIG. 4A or the anti-parallel state of FIG. 4B with respect to the fixed layer PL. In addition, between the fixed layer PL and the free layer FL, a tunnel barrier film TB formed of an insulating material is provided.

Figure 4C:
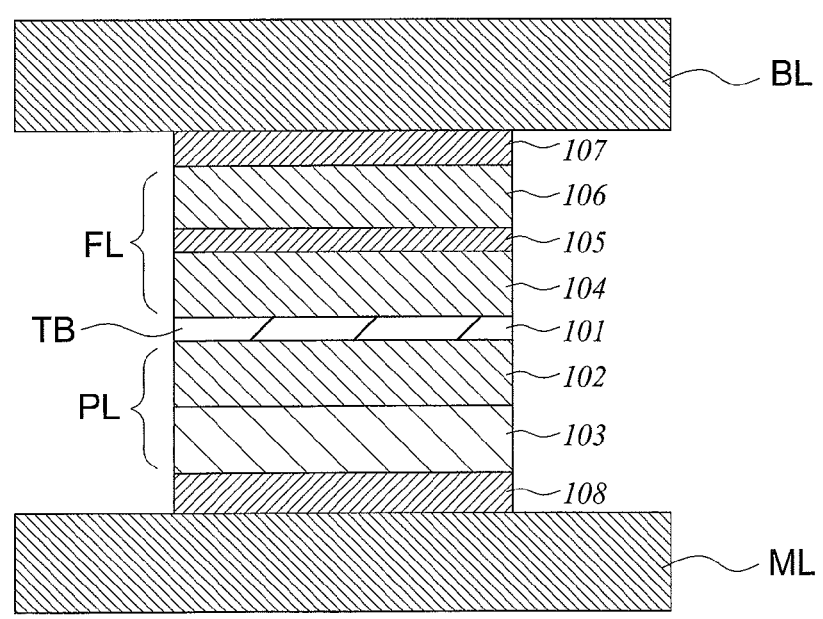
FIG. 4C is an enlarged cross-sectional view of the tunnel magnetoresistive element.

FIG. 4C is an enlarged cross-sectional view of the tunnel magnetoresistive element TMR that is arranged between the metal wire ML and the bit line BL illustrated in FIG. 3 described above. First, a metal layer 108 is arranged above the metal wire 108. Although the fixed layer PL is arranged above the metal layer ML, in this example, the fixed layer PL forms a two-layered structure formed of an antiferromagnetic film 103 and a ferromagnetic film 102. Since the direction of magnetization decided at first is strongly fixed by stacking the ferromagnetic film 102 on the antiferromagnetic film 103 in this way, the fixed layer PL being stable with no change in magnetization by the current and the like upon rewriting can be obtained.

The tunnel barrier film TB formed of an insulating film 101 such as MgO is arranged above the fixed layer PL, and the free layer FL is arranged above the tunnel barrier film TB. Further, a metal layer 107 is arranged above the free layer FL, and the bit line BL is arranged above the metal layer 107.

In this example, the free layer FL has a three-layered structure formed of a ferromagnetic film 104, a metal layer 105 formed of Ru and the like, and a ferromagnetic film 106. The magnetization of the ferromagnetic film 104 and the magnetization of the ferromagnetic film 106 become anti-parallel to each other. It is to be noted here that, although the free layer FL has a three-layered structure that sandwiches one layer of the metal layer 105 by two layers of the ferromagnetic layers 104 and 106, a multilayered structure of four or more layers may be adapted. For example, a structure may be adapted, wherein four ferromagnetic films are used to insert metal layers (in this case, three metal layers are required in total) among these ferromagnetic films. In this way, the formation of the free layer FL of the multilayered structure can enhance resistivity against directional fluctuation of magnetization of the free layer FL due to heat disturbance. In general, when the temperature rises, the direction of magnetization of the free layer FL tends to fluctuate due to heat, and there is a high probability that the direction rotates in the direction opposite to the direction of the writing. However, with the free layer FL of the multilayered structure, a probability of the direction rotating in the direction opposite to the direction of the writing can be suppressed to such an extent of a low level at which practically no problem arises. Further, the threshold value of a current that performs rewrite can be suppressed to be low.

Thus, according to the present embodiment, since deterioration of the film forming the tunnel magnetoresistive element TMR can be suppressed by permitting the currents of the two directions to flow in pairs in the tunnel magnetoresistive element TMR upon rewriting, reliability of the SPRAM can be enhanced. Further, since a stable memory cell strong against heat disturbance can be realized by forming the free layer FL of the tunnel magnetoresistive element TMR into the multilayered structure, the reliability of the SPRAM can be further enhanced.

Second Embodiment

Figure 5A:
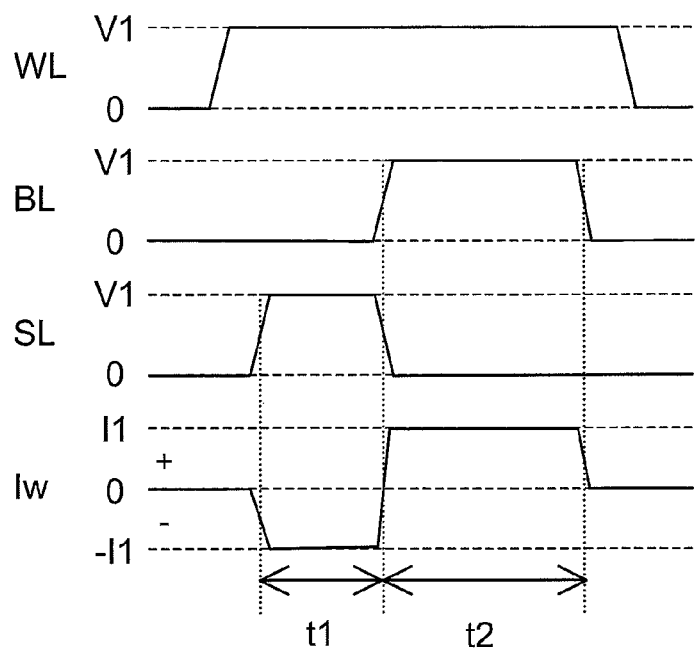
FIGS. 5A and 5B are timing charts illustrating writing operations of an SPRAM, which is a second embodiment of the present invention.
Figure 5B:
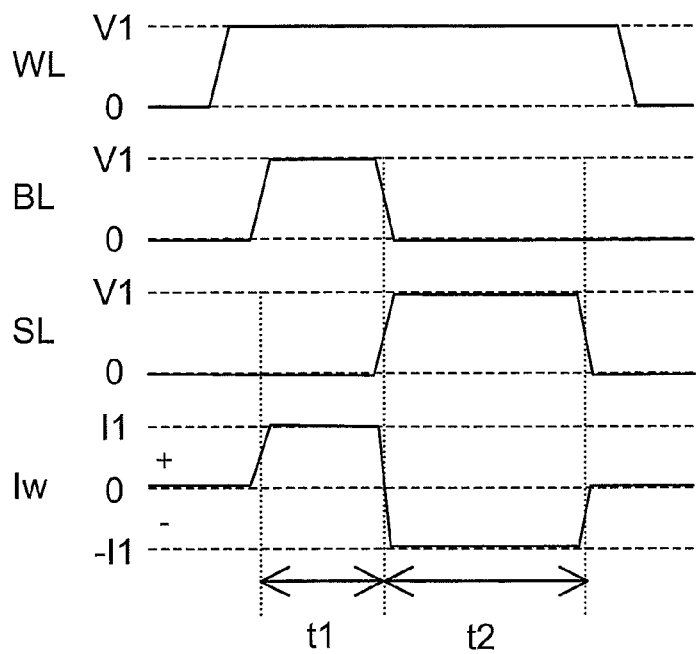

FIGS. 5A and 5B are timing charts illustrating an operation example of a memory cell according to the present embodiment. The configuration of the memory cell is the same as that of the first embodiment. Each of the low level signal of the word line WL, the bit line BL, and the source line SL is set to 0, and each of the high level signal of the same is set to V1. Here, a direction of a current (Iw) corresponding to a direction of the original write information is expressed as a positive direction.

The operation example of the present embodiment is characterized in that a pulse width t1 of a current of the opposite direction caused to flow before the writing of the original information is shorter than a pulse width t2 of the original write current (t1<t2). In the operation example of FIG. 5A, the original write current is I1, and the pulse width t1 of the current −I1 of the opposite direction caused to flow before that is shorter than the pulse width t2 of the original write current −I1. Similarly, in the operation example of FIG. 5B, the original write current is −I1, and the pulse width t1 of the current I1 of the opposite direction caused to flow before that is shorter than the pulse width t2 of the original write current −I1.

According to the present embodiment, an effect of making the rewrite time shorter can be obtained together with the effect of the first embodiment.

Third Embodiment

Figure 6A:
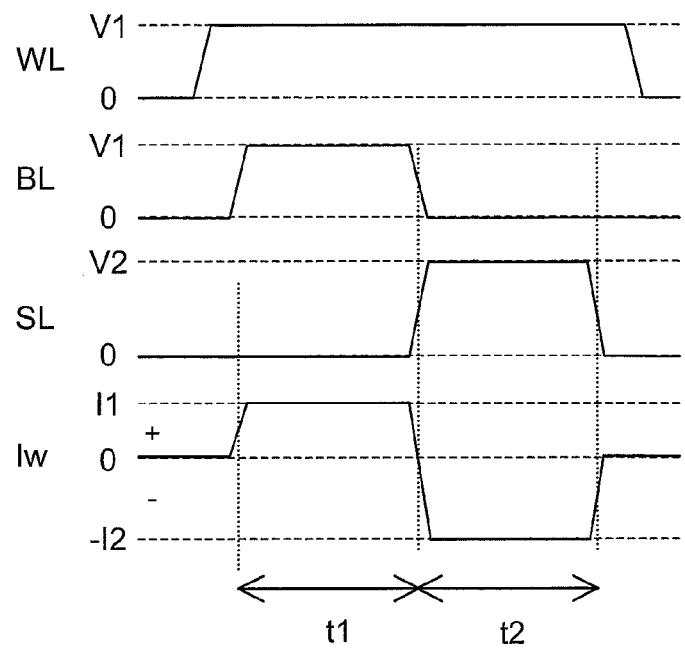
FIGS. 6A and 6B are timing charts illustrating writing operations of an SPRAM, which is a third embodiment of the present invention.
Figure 6B:
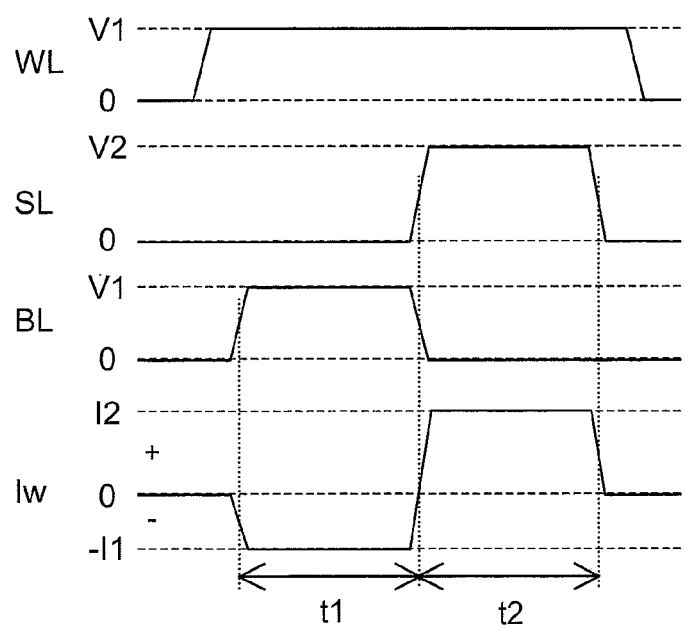

FIGS. 6A and 6B are timing charts illustrating an operation example of a memory cell according to the present embodiment. The configuration of the memory cell is the same as that of the first embodiment. Each of the low level signal of the word line WL, the bit line BL, and the source line SL is set to 0, while the word line WL and the bit line BL are set to V1, and the source line SL is set to V2 in the high level signal. The direction of a current (Iw) corresponding to a direction of the original write information is expressed as a positive direction.

The operation example of the present embodiment is characterized in that magnitude of the absolute value of the current caused to flow before the writing of the original information is greater than the magnitude of the absolute value of the current caused to flow before the writing of the original information. Thus, the original writing can be certainly performed on the memory cell.

In the operation example of FIG. 6A, an original write current is −I2, and this is greater in absolute value than a current (I1) of the opposite direction caused to flow before that (|−I2|>|I1|). Similarly, in the operation example of FIG. 6B, an original write current is I2, and this is greater in absolute value than a current (−I1) of the opposite direction caused to flow before that (|I2|>|−I1|). Here, although an example is illustrated in which write pulse widths t1 and t2 are the same, they may be different.

Also in the present embodiment, even when the same information is sequentially written on the same memory cell, since the currents in the two directions are caused to flow in pairs into the tunnel magnetoresistive element TMR each time information is rewritten, deterioration of the film that forms the tunnel magnetoresistive element TMR can be suppressed.

Fourth Embodiment

Figure 7A:
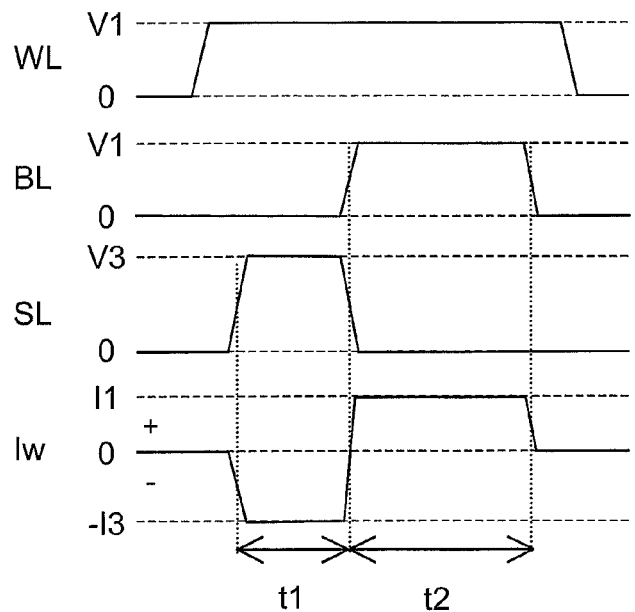
FIGS. 7A and 7B are timing charts illustrating writing operations of an SPRAM, which is a fourth embodiment of the present invention.
Figure 7B:
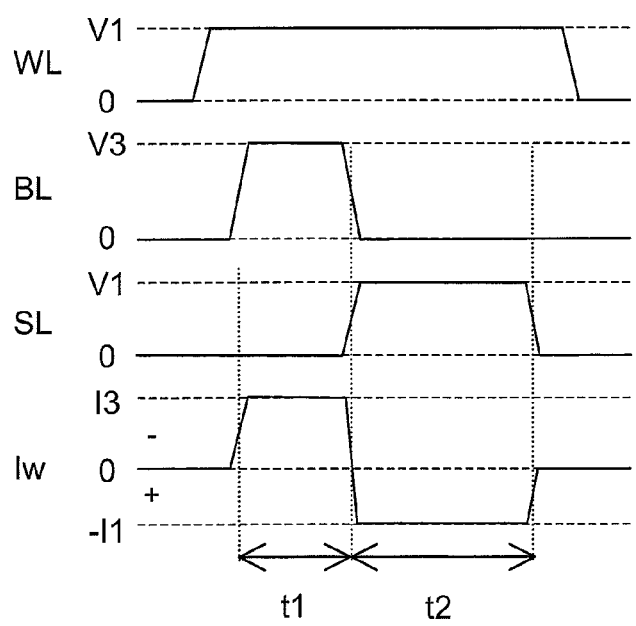

FIGS. 7A and 7B are timing charts illustrating an operation example of a memory cell according to the present embodiment. The configuration of the memory cell is the same as that of the first embodiment. Each of the low level signal of the word line WL, the bit line BL, and the source line SL is set to 0. In the case of the operation example of FIG. 7A, the word line WL and the bit line BL are set to V1, and the source line SL is set to V3 in the high level signal. In the case of the operation example of FIG. 7B, the word line WL and the source line SL are set to V1, and the bit line BL is set to V3 in the high level signal. A direction of a current (Iw) corresponding to the original write information is expressed as a positive direction.

The operation example of the present embodiment is characterized in that a pulse width t1 of a current of the opposite direction caused to flow before the writing of the original information is shorter than a pulse width t2 of a current caused to flow upon the original writing (t1<t2). Thus, the current of the opposite direction can be caused to flow by a necessary and sufficient quantity in a short time so that the rewrite time can be shortened.

In the operation example of FIG. 7A, the original write current is I1, and the pulse width thereof is t2. In contrast to this, a current of the opposite direction caused to flow before I1 is −I3, and the pulse width thereof is t1. Here, −I3 is greater than I1 in the absolute value, but the pulse width t1 thereof is shorter than the pulse width t2 of the original write current. Similarly, in the operation example of FIG. 7B, the original write current is −I1, and the pulse width thereof is t2. In contrast to this, a current of the opposite direction caused to flow before −I1 is I3, and the pulse width thereof is t1. Here, while I3 is greater than −I1 in the absolute value, the pulse width t1 is shorter than the pulse width t2 of the original write current.

Also in the present embodiment, even when the same information is sequentially written in the same memory cell, since the currents in the two directions are caused to flow in pairs into the tunnel magnetoresistive element TMR each time information is rewritten, deterioration of the film that forming the tunnel magnetoresistive element TMR can be suppressed.

Fifth Embodiment

Figure 8A:
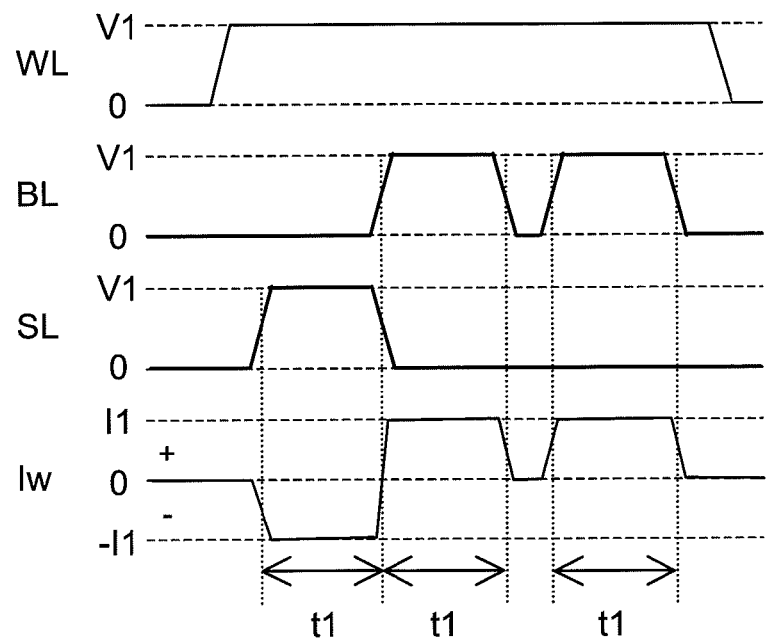
FIGS. 8A and 8B are timing charts illustrating writing operations of an SPRAM, which is a fifth embodiment of the present invention.
Figure 8B:
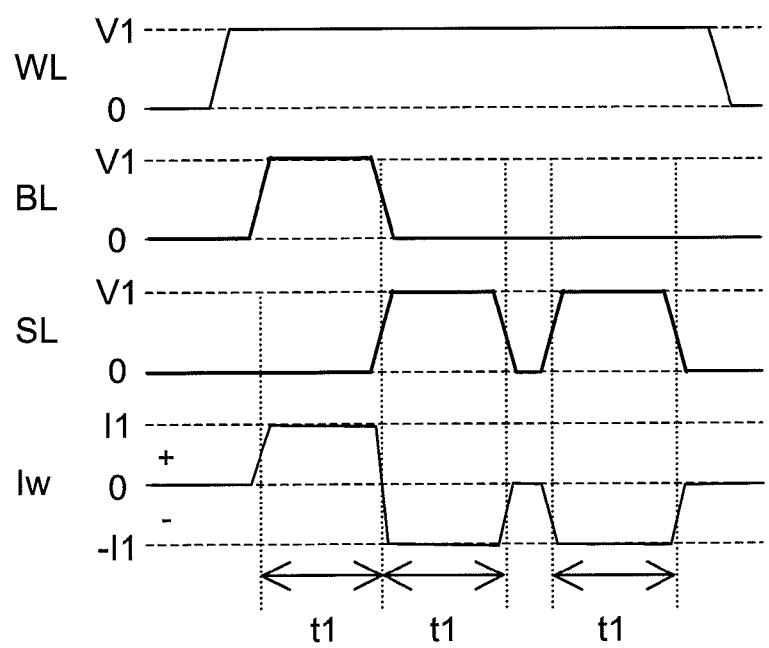

FIGS. 8A and 8B are timing charts illustrating an operation example of a memory cell according to the present embodiment. The configuration of the memory cell is the same as that of the first embodiment. Each of the low level signal of the word line WL, the bit line BL, and the source line SL is set to 0, and each of the high level signal the same is set to V1. Further, a direction of a current (Iw) corresponding to the original write information is expressed as a positive direction.

The present embodiment is characterized in that a current of the opposite direction is caused to flow once having a pulse width t1 before writing of the original information, and a current upon writing the original information is caused to flow twice having the pulse width t1. Thus, a desired writing can be certainly performed by using a single pulse generation circuit.

In the operation example of FIG. 8A, although the original write current I1 is caused to flow twice having the pulse width t1, before that, a current −I1 of the opposite direction is caused to flow once having the pulse width t1. Similarly, in the operation example of FIG. 8B, although the original write current −I1 is caused to flow twice having the pulse width t1, before that, the current I1 of the opposite direction is caused to flow once with the pulse width t1.

Also in the present embodiment, even when the same information is sequentially written in the same memory cell, since the currents in the two directions are caused to flow in pairs into the tunnel magnetoresistive element TMR each time information is rewritten, deterioration of the film that forms the tunnel magnetoresistive element TMR can be suppressed.

Sixth Embodiment

Figure 9:
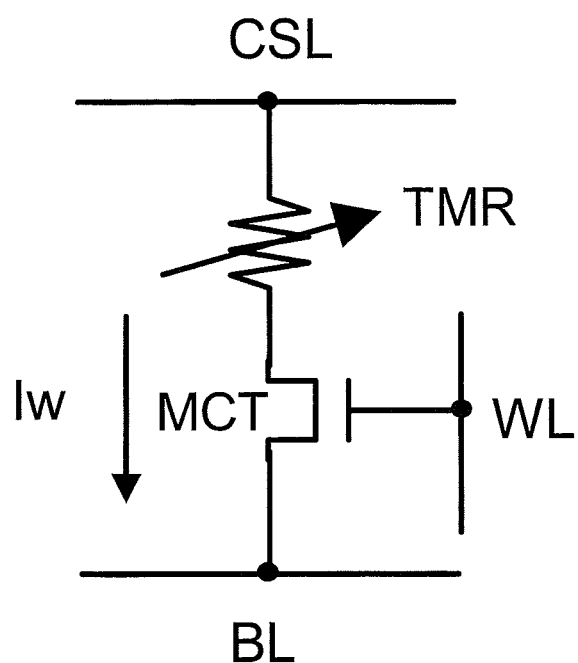
FIG. 9 is an equivalent circuit diagram of an SPRAM, which is a sixth embodiment of the present invention.

FIG. 9 is an equivalent circuit diagram of an SPRAM of the present embodiment. This SPRAM, similarly to the first embodiment, has a memory cell formed of a select transistor MCT and a tunnel magnetoresistive element TMR that having different resistance values according to stored information. However, the select transistor MCT and the tunnel magnetoresistive element TMR are connected in series and arranged between a bit line BL and a common source line CSL. Further, the present embodiment is characterized in that the voltage of the common source line CSL is made constant. Thus, a drive circuit and a memory cell array structure can be simplified.

Figure 10A:
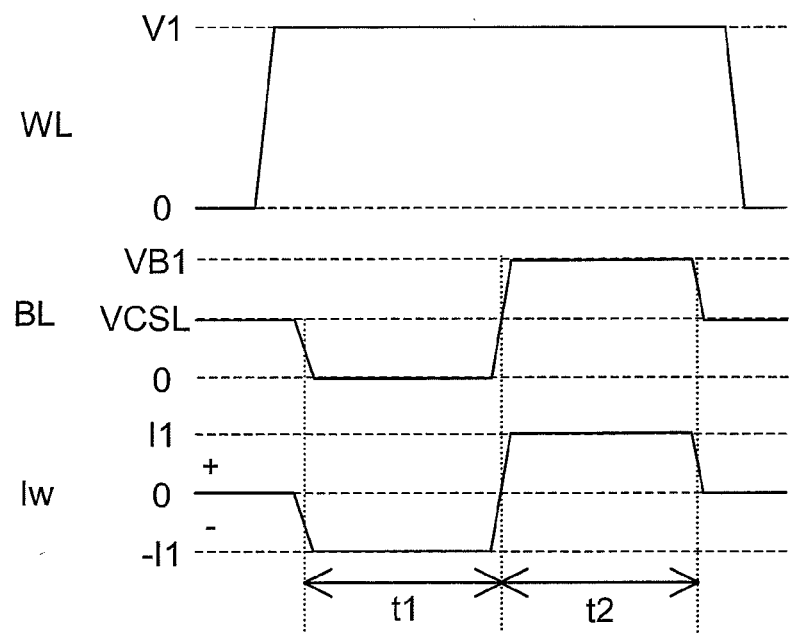
FIGS. 10A and 10B are timing charts illustrating writing operations of the SPRAM, which is the sixth embodiment of the present invention.
Figure 10B:
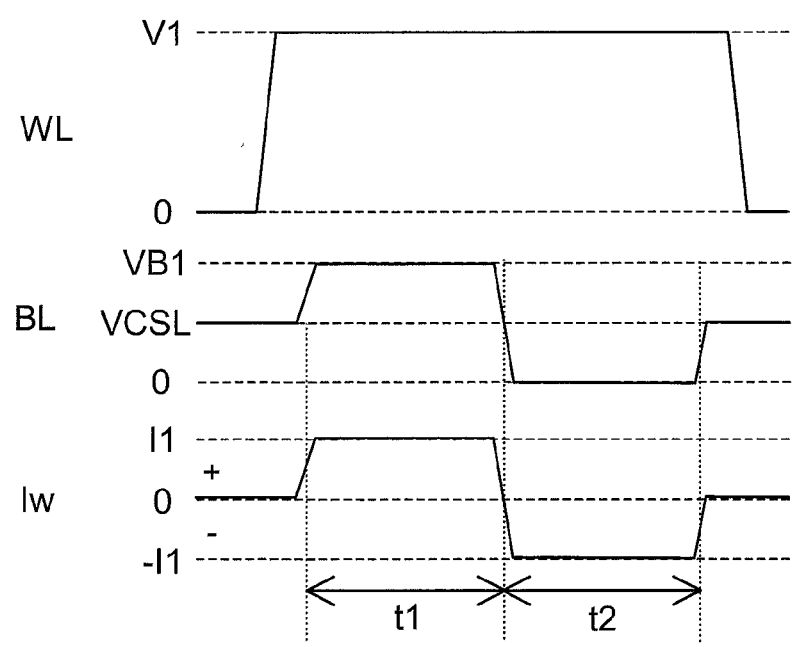

FIGS. 10A and 10B are timing charts illustrating an operation example of the memory cell of the present embodiment. Here, a constant voltage applied to a common source line CSL is expressed as a VCSL. A word line WL is set to 0 in a low level signal, and set to V1 in a high level signal. On the other hand, a bit line BL is set to 0 in a low level signal, and set to VB1 in a high level signal. Further, setting is made in such a way that the VCSL comes between the low level signal 0 and the high level signal VB1 of the bit line BL, and moreover, a value of a current in the direction to be written and a value of a current of the opposite direction caused to flow before that become a desired value, respectively. When rewrite is not performed, the bit line BL is applied with the voltage VCSL.

First, a memory cell is selected by changing the word line WL from the low level 0 to the high level V1. In the operation example of FIG. 10A, an original write current is I1, and the pulse width thereof is t2, while a current of the opposite direction caused to flow before is −I1 and the pulse width thereof is t1. Thus, in a state in which the word line WL becomes the high level V1, a potential of the bit line BL becomes 0 from the VCSL. Thus, the current −I1 of the opposite direction flows only for t1. On the other hand, upon the original writing, the potential of the bit line BL becomes a high level VB1. This causes the current I1 necessary for the original write to flow only for t2. FIG. 10B is an operational example in the case where the write information is opposite to that of FIG. 10A.

Also in the present embodiment, even when the same information is sequentially written in the same memory cell, since the currents in the two directions are caused to flow in pairs into the tunnel magnetoresistive element TMR each time information is rewritten, deterioration of the film that forms the tunnel magnetoresistive element TMR is suppressed.

The effect of the present embodiment will be described in detail by with reference to FIGS. 11A to 12B. A tunnel magnetoresistive element TMR of the memory cell, similarly to the first embodiment, is formed of a fixed layer PL, a free layer FL, and a tunnel barrier film TB. In FIGS. 11A to 11C, the tunnel barrier film TB is illustrated in an enlarged manner.

First, an early tunnel magnetoresistive element TMR in which rewriting is not yet performed has either no trap in the tunnel barrier film TB or a few even when it has a trap as illustrated in FIG. 11A. However, after a one-way current is sequentially caused to flow so many times, as illustrated in FIG. 11B, a large number of traps occur in a vicinity of an interface with the fixed layer PL or an interface with the free layer FL. FIG. 11B shows a state in which the traps occur in the vicinity of the interface with the free layer FL.

When the traps such as those described above occur within the tunnel barrier film TB, there are some cases where a current flows inside the tunnel barrier film TB through these traps or the tunnel barrier film TB is deteriorated by this current and eventually ends up with causing a punch-through.

However, according to the above-described write operation of the present invention, even when the one way current is sequentially caused to flow so many times inside the tunnel barrier film TB, since the currents in the two directions are always caused to flow in pairs, the number of traps occurred in the tunnel barrier film TB is few and the distribution thereof is impartial as illustrated in FIG. 11C. Consequently, deterioration of the tunnel barrier film TB is suppressed, and this leads to enhance of reliability of the memory cell. Incidentally, to realize this effect, there is always no need to complete the writing of opposite information when the current of the opposite direction is caused to flow before the original writing is performed. That is, the supply of the current of the opposite direction may be stopped before the writing of opposite information is completely terminated.

In the SPRAM, since the relative directions of magnetization between the fixed layer PL and the free layer FL sandwiching the tunnel barrier film TB become a parallel state or an anti-parallel state, a difference of electric resistances in these two states is stored as binary-level information of "1" and "0". FIG. 12A illustrates a state in which the relative directions of magnetization between the fixed layer PL and the free layer FL become anti-parallel in the early tunnel magnetoresistive element TMR in which the rewriting is not yet performed. In this state, assume that the writing of the storage information corresponding to this direction of magnetization is sequentially performed many times. In this case, although the direction of magnetization does not change, since the current flows many times, a spin that realizes the magnetization of the free layer FL by this current obtains energy. As a result, as illustrated in FIG. 12B, there is a chance that a part of the free layer FL may rotate in the opposite direction. Such a state is equivalent to lowering of a signal amount for the memory cell. Further, other disturb resistances also become weak, and the retention time also becomes short. However, in the write operation of the present invention, even when the writing corresponding to one-way magnetization is repeated so many times for the same memory cell, since the currents in the two directions are caused to flow in pairs in this memory cell each time information is rewritten, such phenomenon as described above hardly occurs.

Seventh Embodiment

FIG. 13 is a circuit diagram illustrating the memory cell arrays of SPRAM according to the present embodiment. MC11 and MC12 in the drawing representatively show memory cells from among the memory cell arrays.

Each of the memory cells MC11 and MC12 formed of a select transistor MS and a tunnel magnetoresistive element TMR is connected to a lower local bit line BL1 and a lower local source line SL1, and a memory cell array AR11 is connected to an upper global bit line GB11 together with a memory cell array AR21 having the same configuration. Further, a global bit line GB12 next to the global bit line GB11 is connected with memory cell arrays AR12 and AR22 having the same configuration as that of the memory cell array AR11. A configuration of the memory cell array AR11 will be described. A rewrite driver is provided for the local bit line BL1 and the local source line SL1, respectively. That is, a bit line driver WB1 and a source line driver WS1 are arranged for the local bit line BL1 and the local source line SL1. One of input terminals of these drivers (WB1 and WS1) is connected to the global bit line GB11, and the other is connected to selection signal lines WSS1 and WBS1. Here, there are some cases where the bit line driver WB1 and the source line driver WS1 are physically arranged on the opposite side by sandwiching the memory cell array AR11. Further, for the purpose of reading, a circuit RS11 for selectively connecting the global bit line GB11 with the local bit line BL1, and a circuit RS12 for selectively grounding the local source line SL1 are arranged, and a selection signal for that is RS1.

According to these circuits, since the local bit line and the local source line are arranged per a small number of memory cells, a necessary and sufficient write current can be supplied to the memory cell upon rewriting the information. Since parasitic capacitances of the local bit line and the local source line are small, power consumption is also small. Moreover, since the parasitic resistances of the local bit line and the local source line are also small, a voltage drop is also small. Therefore it is possible to perform rewriting at a low voltage. Further, since the bit line driver and the source line driver are arranged on the opposite side by sandwiching the memory cell array, memory cell position dependency of a current pathway can be further minimized.

FIG. 14 is a timing chart illustrating the current rewriting operation example illustrated in FIG. 13. Here, a description will be made by exemplifying a case, in which the memory cell MC11 connected to the local bit line BL1 and the local source line SL1 is selected.

In this operation example, a signal corresponding to rewrite information is given by the global bit line GB11. That is, a signal in which the global bit line GB11 becomes a low level corresponds to the information to be originally written. Consequently, as the feature of the rewriting operation of the present invention, first, a signal in the direction opposite thereto is given. This operation will be described below step by step.

First, the global bit line GB11 becomes a high level from a low level. This is a signal in the direction opposite to the direction of the original signal. Here, the selection signal lines WSS1 and WBS1 are selected, and the rewrite drivers WB1 and WS1 of the local bit line BL1 and the local source line SL1 are activated. As the word line W11 is selected, a rewrite current in the direction opposite to the direction of an original rewrite current Iw flows in the memory cell MC11.

Then, the word line W11 becomes not-selected, and the selection signal lines WSS1 and WBS1 return to the original state, and the global bit line GB11 also becomes a low level. Subsequently, the step advances to writing of a signal to be originally written. The signal of the global bit line GB11 is set to a low level corresponding to the original write signal. In this state, the selection signal lines WSS1 and WBS1 are selected, and the rewrite drivers WB1 and WS1 of the local bit line BL1 and the local source line SL1 are activated, and the word line W11 is selected. This causes the rewrite current Iw of the original direction to flow in the memory cell MC11.

FIG. 15 is a case where the original rewrite signal is opposite to the operation example of FIG. 14. In this case, the global bit line GB11 upon the initial rewriting is set to a low level, and, upon the subsequent original rewriting, the global bit line GB11 becomes a high level. The selection signal lines WSS1 and WBS1 and the word line W11 perform the same operations as those of FIG. 14. Incidentally, the magnitude and the pulse width of the absolute value of mutual currents of the current pulses in the opposite directions and the current pulses in the original direction are deformable like the above-described embodiments depending on an intended use. Thus, according to the present operation example, the rewrite current pulses in the two directions, which are the feature of the present invention, can be applied to the memory cell array provided with the hierarchical bit lines and source lines of FIG. 13.

Eighth Embodiment

FIG. 16 is a circuit diagram illustrating another example of a memory cell array of SPRAM. This circuit illustrates a signal line IO that transmits rewrite information from the outside of a semiconductor chip formed with an SPRAM, and a circuit configuration among the memory cell arrays illustrated in FIG. 13. The configuration of the memory cell arrays connected to the global bit lines GB11 and GB12 is the same as that illustrated in FIG. 13.

The global bit lines GB11 and GB12 are bundled together in a group by selection switches GS11 and GS12, and become a signal line GIO. The signal line GIO is connected to a sense amplifier/rewrite latch (SA/DL) serving as a sense amplifier and a rewrite data latch by a read selection signal. A rewrite signal that is latched and transmitted by the SA/DL from the signal line IO emerges in a terminal SIO of this SA/DL at the rewrite time (WE is activated). A readout signal from the memory cell emerges at the readout time (RE is activated) as a result of amplification by the SA/DL, while a SAA is a start signal of the SA/DL.

The SA/DL is inputted with the rewrite signal from the signal line IO connected by a column selection signal YS. The SA/DL outputs the read signal of the memory cell to the signal line IO. The signal line GIO is connected to a circuit PCC that outputs an output according to the signal of the terminal SIO under the control of PW and MW by a rewrite selection signal WE. According to such a circuit configuration, the rewrite current pulses in the two directions, which are the feature of the present invention, can be applied to the memory cell.

FIG. 17 is a timing chart illustrating an operation example of the circuit. First, the signal line IO changes from a low level to a high level corresponding to the write signal given from a semiconductor chip or from the outside of a memory macro. Here, the column selection signal YS is activated, and the activation signal SAA thereof is fetched and latched by the sense amplifier/rewrite latch (SA/DL).

Next, a rewrite selection signal WE is activated, and the circuit PCC and the signal line GIO are electrically connected to each other. At the same time, the global bit line GB11 is activated, and the output of the circuit PCC is electrically connected to the global bit line GB11. Here, first, PW becomes a high level, while MW remains at a low level. Thus, a signal of the polarity opposite to that of the signal to be originally rewritten appears on the global bit line GB11. Then, rewrite driver activation signals WSS1 and WSB1, and a word line W11 are selected, and a current signal in the direction opposite to the direction of the original signal flows in the memory cell. When this operation is terminated, the rewrite driver activation signals WSS1 and WBS1, the word line W11, and PW return to the original state. Next, MW becomes a high level. PW remains at a low level. In this state, a signal corresponding to the original write signal is outputted from the circuit PCC. This causes the signal to be originally rewritten to appear on the global bit line GB11, and the rewrite driver activation signals WSS1 and WBS1 as well as the word line W11 are selected, and a current signal in the direction of the original signal flows in the memory cell. When the original rewrite signal is opposite to this operation example, although a signal of the opposite direction appears on the signal line IO, the operation thereof can be performed similarly to this operation example, and an operation to cause a current of the direction opposite to the direction of the current necessary for the original rewrite to flow in the memory cell can be achieved. According to such an operation example, the rewrite current pulses in the two directions can be applied to the memory cell, which are the feature of the present invention.

Ninth Embodiment

FIG. 18 is a plan view illustrating another example of a memory cell array of SPRAM. In the present embodiment, a local bit line and a source bit line are arranged below a global bit line. An upper global bit line is not illustrated. An area of the memory cell is $8F^2$ when a wiring pitch of the word line or the bit line is assumed to be 2F.

FIG. 19 illustrates a cross-sectional view of a memory cell array (MCA) taken along the line A-A' of FIG. 18 and a cross-sectional view of a peripheral circuit (SAB) that is not illustrated in FIG. 18. FIG. 20A is a cross-sectional view of a memory cell array taken along the line B-B' of FIG. 18, and FIG. 20B is a cross-sectional view of the memory cell array taken along the line C-C' of FIG. 18.

The memory cell is formed of one nMOS transistor and one tunnel magnetoresistive element, and a word line is connected to a gate electrode GN of the nMOS transistor. The material of the gate electrode GN is polysilicon or a low-resistance conductive film of silicide or tungsten stacked to an upper portion of polysilicon. The nMOS transistor of the memory cell and the nMOS transistor of the peripheral circuit are formed on a p-type semiconductor region PWEL. A pMOS transistor of the peripheral circuit is formed on an n-type semiconductor region NWEL. The p-type semiconductor region PWEL and the n-type semiconductor region NWEL are formed to an upper portion of an n-type semiconductor region DWEL formed on a main surface of a p-type silicon substrate (p-Sub).

One side of a diffusion layer LN of the nMOS transistor that forms a part of the memory cell is connected with a source line contact SLC. The source line contact SLC is shared by an adjacent memory cell, and is reduced in area. Above the source line contact SLC, the source line SL is wired in the direction orthogonal to the word line (gate electrode GN). On the other hand, the diffusion layer LP of the nMOS transistor not connected with the source line contact SLC is connected with a lower electrode contact BEC. The lower electrode contact BEC is connected to a tunnel magnetoresistive element TMR through a lower electrode BE.

The tunnel magnetoresistive element TMR includes at least one layer of a tunnel barrier film TB, and a fixed layer PL and a free layer FL which are formed of magnetic materials arranged on the upper and lower sides of the tunnel barrier film TB. The fixed layer PL has the direction of spin of an internal electron fixed in a constant direction, whereas the free layer FL has the direction of spin of the internal electron set in either parallel or anti-parallel state to the fixed layer PL. In this example, the fixed layer PL is arranged between the tunnel barrier film TB and the lower electrode BE, and the free layer FL is arranged between the bit line BL arranged to an upper layer of the tunnel magnetoresistive element TMR and the tunnel barrier film TB. The bit line BL is orthogonal to the word line (gate electrode GN), and is arranged in parallel with the source line SL. A planar shape of the tunnel magnetoresistive element TMR is formed in a long rectangle shape or an oval shape as compared with the direction in which a direction parallel to the bit line BL is parallel to the word line. Consequently, there is an advantage that retention characteristics of the direction of spin of the free layer FL become excellent.

By using the memory cell thus configured, it is possible to achieve an operation that is the feature of the present invention performing the rewriting with characteristics opposite to the original rewriting before performing the original rewriting.

Tenth Embodiment

FIG. 21 is a plan view illustrating another example of a memory cell array of SPRAM. FIG. 22 is a cross-sectional view of the memory cell array taken along the line A-A' of FIG. 21, and FIG. 23 is a cross-sectional view of the memory cell array taken along the line B-B' of FIG. 21.

The memory cell of the present embodiment includes two gate electrodes GN and one tunnel magnetoresistive element TMR. These gate electrodes GN form a word line. Diffusion layers (source and drain regions) of the memory cell are separated by the gate electrode GN only, and the memory cells adjoining each other are separated by utilizing electric insulation of the gate voltage at 0 V. This leads to achieve a small cell area by utilizing two nMOS transistors for one memory cell.

Metal wirings are denoted by M1 to M5, and contact layers between the wiring layers are denoted by V1 to V3. The contact layer with the metal wiring M1 and the diffusion layer or the gate electrode GN is denoted by V0. A tunnel magnetoresistive element TMR is arranged between the metal wiring M4 and the metal wiring M5, and is arranged so as to be positionally shifted from the contact layer V3.

The metal wiring M1 is used as a local source line or a local bit line, and the resistance of the metal wiring M2 is lowered by connecting word lines formed of polysilicon at regular intervals. The metal wiring M3 is used as the global bit line (available for writing purpose, reading purpose or for both purposes) and the global source line. The local bit line is orthogonal to the word line, and is arranged in parallel with the local source line.

By using the memory cell thus laid out, it is possible to achieve an operation performing the rewriting with characteristics opposite to the original rewrite before performing the original rewrite that is the feature of the present invention.

Eleventh Embodiment

FIG. 24 is a cross-sectional view illustrating another example of a memory cell array of SPRAM. The memory cell of the present embodiment is formed of a vertical MOS transistor, and therefore, when F is assumed as a minimum processing size, a cell area can be reduced to $4F^2$. GA denotes a gate electrode, and upper and lower $n^+$ regions of the gate electrode GA constitute source and drain regions. When a predetermined gate voltage is applied to the gate electrode GA, a current flows between the upper and lower n⁺ regions (source and drain regions) through a p region. The gate electrode GA sometimes annularly wraps up the p region or sandwiches the p region from two or three directions. In addition, the vertical MOS transistor can be formed of any one of an n-channel type MOS transistor and a p-channel type MOS transistor.

A tunnel magnetoresistive element TMR, similarly to the above-described embodiments, includes the tunnel barrier film TB and a fixed layer PL and a free layer FL composed of magnetic materials arranged on the upper and lower sides of the tunnel barrier film TB. Although FIG. 24 illustrates an example in which the fixed layer PL is arranged above the free layer FL, the free layer FL may be arranged above the fixed layer PL. It is also possible to arrange the vertical MOS transistor above the tunnel magnetoresistive element TMR.

By using the memory cell thus configured, it is possible to achieve an operation performing the rewriting with characteristics opposite to the original rewriting before performing the original rewriting and that is the feature of the present invention.

Twelfth Embodiment

A direction of magnetization in a fixed layer PL and a free layer FL of a tunnel magnetoresistive element TMR may be vertical to a tunnel barrier film TB as illustrated in FIGS. 25A and 25B. This can be achieved by using a material that shifts directions of magnetization in this way for the fixed layer PL and the free layer FL. The tunnel magnetoresistive element TMR having such direction of magnetization has an advantage because its two states (parallel and anti-parallel) are stable against disturbance due to heat as compared with the tunnel magnetoresistive element TMR having a direction of magnetization parallel to the tunnel barrier film TB. Consequently, by using such tunnel magnetoresistive element TMR, even when scaling of a memory cell is progressed, the memory cell stably operating in a wide temperature range can be achieved.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention can be used in a semiconductor storage device having a memory cell that stores information by utilizing the change of magnetic resistance.

The invention claimed is:
1. A semiconductor storage device comprising:
a plurality of word lines;
a plurality of bit lines and a plurality of source lines extending in a direction orthogonal to the plurality of word lines, respectively; and
a plurality of memory cells arranged at predetermined intersection points of the plurality of word lines, the plurality of bit lines, and the plurality of source lines, the memory cell being formed of a select transistor and a tunnel magnetoresistive element having different resistance values according to stored information,
the tunnel magnetoresistive element having a tunnel barrier film with a fixed layer and a free layer formed of magnetic materials arranged and both sides the tunnel barrier film,
the fixed layer having a direction of magnetization fixed to a predetermined direction, and the free layer having a direction of magnetization either parallel or anti-parallel to the direction of electron spin of the fixed layer,
the tunnel magnetoresistive element having different resistance values depending on whether the direction of magnetization of the free layer is parallel or anti-parallel to the direction of electron spin of the fixed layer,
the direction of magnetization of the free layer being changed by a direction of a current flowing in the tunnel magnetoresistive element,
a gate electrode of the select transistor being electrically connected to the word line,
one of the source and drain regions of the select transistor being electrically connected to one of the other terminals of the tunnel magnetoresistive element,
the other terminal of the tunnel magnetoresistive element being electrically connected to one of the bit line or the source line, and
the other of the source and drain regions of the select transistor being electrically connected to the other of the bit line or the source line,
wherein, to write information in the memory cell, a current in a direction opposite to a current necessary for writing is supplied to the memory cell, and then, a circuit for supplying the current necessary for writing is provided.

2. The semiconductor storage device according to claim 1, wherein a pulse width of the current of the opposite direction is shorter than a pulse width of the current necessary for writing.

3. The semiconductor storage device according to claim 1, wherein magnitude of an absolute value of the current necessary for writing is greater than magnitude of an absolute value of the current of the opposite direction.

4. The semiconductor storage device according to claim 1, wherein a pulse width of the current of the opposite direction is shorter than a pulse width of the current necessary for writing, and magnitude of an absolute value of the current of the opposite direction is greater than magnitude of an absolute value of the current necessary for the write.

5. The semiconductor storage device according to claim 1, wherein a pulse width of the current of the opposite direction and magnitude of an absolute value of the current are identical to a pulse width of the current necessary for writing and magnitude of an absolute value of the current, respectively, and
a number of times for flowing the current necessary for writing is greater than a number of times for flowing the current of the opposite direction.

6. The semiconductor storage device according to claim 1, wherein the free layer of the tunnel magnetoresistive element is formed of a multilayered structure that sandwiches metal layers among the plurality of ferromagnetic films, respectively.

7. The semiconductor storage device according to claim 1, wherein the fixed layer of the tunnel magnetoresistive element is formed of a stacked structure of a ferromagnetic film and an antiferromagnetic film.

8. The semiconductor storage device according to claim 1, wherein respective directions of magnetization of the fixed layer and the free layer of the tunnel magnetoresistive element are vertical to joint surfaces with the fixed layer and the free layer and also with the tunnel barrier film.

9. The semiconductor storage device according to claim 1, wherein the select transistor is formed of a vertical MOS transistor, and the tunnel magnetoresistive element is arranged above or below the vertical MOS transistor.

* * * * *